US011171021B2

(12) United States Patent
Singh et al.

(10) Patent No.: US 11,171,021 B2
(45) Date of Patent: Nov. 9, 2021

(54) INTERNAL PLASMA GRID FOR SEMICONDUCTOR FABRICATION

(71) Applicant: Lam Research Corporation, Fremont, CA (US)

(72) Inventors: Harmeet Singh, Fremont, CA (US); Thorsten Lill, Santa Clara, CA (US); Alex Paterson, San Jose, CA (US); Richard A. Marsh, San Ramon, CA (US); Saravanapriyan Sriraman, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 479 days.

(21) Appl. No.: 14/943,483

(22) Filed: Nov. 17, 2015

(65) Prior Publication Data

US 2016/0141188 A1 May 19, 2016

Related U.S. Application Data

(63) Continuation of application No. 13/916,318, filed on Jun. 12, 2013, now Pat. No. 9,245,761.

(Continued)

(51) Int. Cl.
*C23C 16/00* (2006.01)
*H01L 21/67* (2006.01)
(Continued)

(52) U.S. Cl.
CPC .. *H01L 21/67069* (2013.01); *H01J 37/32009* (2013.01); *H01J 37/3244* (2013.01);
(Continued)

(58) Field of Classification Search
CPC ................. H01J 37/321; H01J 37/3211; H01J 37/32119; H01J 37/32128;
(Continued)

(56) References Cited

U.S. PATENT DOCUMENTS 3,849,276 A 11/1974 Greiner
4,600,464 A 7/1986 Desilets et al.
(Continued)

FOREIGN PATENT DOCUMENTS

CN 1643642 A 7/2005
CN 1716530 A 1/2006
(Continued)

OTHER PUBLICATIONS

U.S. Patent Application entitled "Plasma-Enhanced Etching in an Augmented Plasma Processing System," Hudson et al., U.S. Appl. No. 15/237,521, filed Aug. 15, 2016.
(Continued)

*Primary Examiner* — Luz L Alejandro Mulero
(74) *Attorney, Agent, or Firm* — Weaver Austin Villeneuve & Sampson LLP

(57) ABSTRACT

The embodiments disclosed herein pertain to improved methods and apparatus for etching a semiconductor substrate. A plasma grid assembly is positioned in a reaction chamber to divide the chamber into upper and lower sub-chambers. The plasma grid assembly may include one or more plasma grids having slots of a particular aspect ratio, which allow certain species to pass through from the upper sub-chamber to the lower sub-chamber. Where multiple plasma grids are used, one or more of the grids may be movable, allowing for tenability of the plasma conditions in at least the lower sub-chamber. In some cases, an electron-ion plasma is generated in the upper sub-chamber. Electrons that make it through the grid to the lower sub-chamber are cooled as they pass through. In some cases, this results in an ion-ion plasma in the lower sub-chamber.

21 Claims, 10 Drawing Sheets

Related U.S. Application Data

(60) Provisional application No. 61/809,246, filed on Apr. 5, 2013.

(51) Int. Cl.
  *H01L 21/3065* (2006.01)
  *H01L 21/311* (2006.01)
  *H01L 21/3213* (2006.01)
  *H01J 37/32* (2006.01)

(52) U.S. Cl.
  CPC .. *H01J 37/32422* (2013.01); *H01J 37/32633* (2013.01); *H01J 37/32715* (2013.01); *H01L 21/3065* (2013.01); *H01L 21/31116* (2013.01); *H01L 21/31138* (2013.01); *H01L 21/32136* (2013.01); *H01J 2237/334* (2013.01)

(58) Field of Classification Search
  CPC ........... H01J 37/32137; H01J 37/32146; H01J 37/32155; H01J 37/32165; H01J 37/32174; H01J 37/32183; H01J 37/3244; H01J 37/32449; H01J 37/32623; H01J 37/32633; H01J 37/32651; H01J 37/32009; H01J 37/32422; H01L 21/67069
  See application file for complete search history.

(56) References Cited

U.S. PATENT DOCUMENTS

| | | |
|---|---|---|
| 5,015,331 A | 5/1991 | Powell |
| 5,221,366 A | 6/1993 | Roberts et al. |
| 5,248,371 A * | 9/1993 | Maher ............... H01J 37/32541 118/723 E |
| 5,431,774 A | 7/1995 | Douglas |
| 5,474,648 A | 12/1995 | Patrick et al. |
| 5,476,182 A | 12/1995 | Ishizuka et al. |
| 5,683,548 A | 11/1997 | Hartig et al. |
| 5,705,443 A | 1/1998 | Stauf et al. |
| 5,710,486 A | 1/1998 | Ye et al. |
| 5,746,875 A | 5/1998 | Maydan et al. |
| 5,753,886 A | 5/1998 | Iwamura et al. |
| 5,849,135 A | 12/1998 | Selwyn |
| 6,007,673 A | 12/1999 | Kugo et al. |
| 6,013,580 A | 1/2000 | Yanagida |
| 6,101,970 A | 8/2000 | Koshimizu |
| 6,162,323 A * | 12/2000 | Koshimizu ......... H01J 37/3244 118/723 I |
| 6,214,162 B1 | 4/2001 | Koshimizu |
| 6,238,527 B1 | 5/2001 | Sone et al. |
| 6,267,074 B1 | 7/2001 | Okumura |
| 6,352,049 B1 | 3/2002 | Yin et al. |
| 6,663,715 B1 | 12/2003 | Yuda et al. |
| 6,689,283 B2 | 2/2004 | Hattori et al. |
| 6,794,301 B2 | 9/2004 | Savas |
| 6,851,384 B2 | 2/2005 | Yuda et al. |
| 6,861,643 B2 | 3/2005 | Ichiki et al. |
| 6,949,735 B1 | 9/2005 | Hatakeyama et al. |
| 6,998,014 B2 | 2/2006 | Chen et al. |
| 7,244,474 B2 | 7/2007 | Hanawa et al. |
| 7,291,360 B2 | 11/2007 | Hanawa et al. |
| 7,311,796 B2 | 12/2007 | Goto et al. |
| 7,381,291 B2 | 6/2008 | Tobe et al. |
| 7,392,759 B2 | 7/2008 | Yuda et al. |
| 7,500,445 B2 | 3/2009 | Zhao et al. |
| 7,520,999 B2 | 4/2009 | Chandrachood et al. |
| RE40,951 E | 11/2009 | Kodaira et al. |
| 7,695,590 B2 | 4/2010 | Hanawa et al. |
| 7,749,353 B2 | 7/2010 | Rusu et al. |
| 7,767,561 B2 | 8/2010 | Hanawa et al. |
| 7,909,961 B2 | 3/2011 | Kumar et al. |
| 7,943,005 B2 | 5/2011 | Kumar et al. |
| 8,058,156 B2 | 11/2011 | Hanawa et al. |
| 8,349,128 B2 | 1/2013 | Todorow et al. |
| 8,356,575 B2 | 1/2013 | Sasaki et al. |
| 8,956,461 B2 | 2/2015 | Hudson et al. |
| 9,017,526 B2 | 4/2015 | Singh et al. |
| 9,039,911 B2 | 5/2015 | Hudson |
| 9,147,581 B2 | 9/2015 | Guha |
| 9,184,028 B2 | 11/2015 | Dhindsa et al. |
| 9,230,819 B2 | 1/2016 | Paterson et al. |
| 9,245,761 B2 | 1/2016 | Singh et al. |
| 9,257,295 B2 | 2/2016 | Singh et al. |
| 9,288,889 B2 | 3/2016 | Radovanov et al. |
| 9,418,859 B2 | 8/2016 | Hudson et al. |
| 9,431,269 B2 | 8/2016 | Guha |
| 9,633,846 B2 | 4/2017 | Paterson et al. |
| 9,793,126 B2 | 10/2017 | Dhindsa et al. |
| 9,922,803 B2 | 3/2018 | Huang et al. |
| 10,134,605 B2 | 11/2018 | Guha |
| 10,224,221 B2 | 3/2019 | Singh et al. |
| 2001/0006169 A1 | 7/2001 | Hogan et al. |
| 2001/0008805 A1 | 7/2001 | Kitagawa |
| 2002/0000202 A1 | 1/2002 | Yuda et al. |
| 2002/0023831 A1 | 2/2002 | Iwase et al. |
| 2002/0068458 A1 | 6/2002 | Chiang et al. |
| 2002/0179248 A1 | 12/2002 | Kabansky |
| 2003/0124842 A1 | 7/2003 | Hytros et al. |
| 2003/0143328 A1 | 7/2003 | Chen et al. |
| 2003/0227258 A1 | 12/2003 | Strang et al. |
| 2004/0014325 A1 | 1/2004 | Laermer et al. |
| 2004/0025791 A1 | 2/2004 | Chen et al. |
| 2004/0071876 A1 | 4/2004 | Rakhimov et al. |
| 2004/0219737 A1 | 11/2004 | Quon |
| 2004/0221958 A1 | 11/2004 | Loewenhardt et al. |
| 2005/0005859 A1 | 1/2005 | Koshiishi et al. |
| 2005/0025791 A1 | 2/2005 | Remenar et al. |
| 2005/0070105 A1 | 3/2005 | Bailey, III et al. |
| 2005/0087140 A1 | 4/2005 | Yuda et al. |
| 2005/0098265 A1 | 5/2005 | Fink et al. |
| 2005/0211171 A1 | 9/2005 | Hanawa et al. |
| 2005/0211546 A1 | 9/2005 | Hanawa et al. |
| 2005/0211547 A1 | 9/2005 | Hanawa et al. |
| 2005/0217582 A1 | 10/2005 | Kim et al. |
| 2005/0287811 A1 | 12/2005 | Lnukai |
| 2006/0000805 A1 * | 1/2006 | Todorow ................... C23F 4/00 216/68 |
| 2006/0019039 A1 * | 1/2006 | Hanawa ................ C23C 14/046 427/523 |
| 2006/0021701 A1 | 2/2006 | Tobe et al. |
| 2006/0021968 A1 | 2/2006 | Walton et al. |
| 2006/0065367 A1 | 3/2006 | Chen et al. |
| 2006/0102286 A1 * | 5/2006 | Kim ....... C23C 16/452 156/345.35 |
| 2006/0113037 A1 | 6/2006 | Nishio |
| 2007/0000611 A1 | 1/2007 | Shannon et al. |
| 2007/0017898 A1 | 1/2007 | Kumar et al. |
| 2007/0068624 A1 | 3/2007 | Jeon et al. |
| 2007/0163994 A1 | 7/2007 | Rauf et al. |
| 2007/0186855 A1 | 8/2007 | Dhindsa |
| 2007/0235137 A1 | 10/2007 | Tsukamoto et al. |
| 2007/0247073 A1 | 10/2007 | Paterson et al. |
| 2008/0020574 A1 | 1/2008 | Marakhtanov et al. |
| 2008/0035608 A1 * | 2/2008 | Thomas ................ C23C 16/452 216/67 |
| 2008/0060759 A1 * | 3/2008 | Chen ................. H01J 37/32192 156/345.41 |
| 2008/0099426 A1 | 5/2008 | Kumar et al. |
| 2008/0099431 A1 | 5/2008 | Kumar et al. |
| 2008/0099439 A1 | 5/2008 | Chang et al. |
| 2008/0100214 A1 | 5/2008 | Chang et al. |
| 2008/0160776 A1 | 7/2008 | Dhindsa et al. |
| 2008/0178805 A1 * | 7/2008 | Paterson ........... H01J 37/32091 118/723 I |
| 2008/0193673 A1 | 8/2008 | Paterson et al. |
| 2008/0280429 A1 | 11/2008 | Mathew et al. |
| 2009/0084501 A1 | 4/2009 | Chen et al. |
| 2009/0114244 A1 | 5/2009 | Sexton et al. |
| 2009/0142929 A1 | 6/2009 | Chen et al. |
| 2009/0162262 A1 | 6/2009 | Bera et al. |
| 2009/0183833 A1 | 7/2009 | Kim |
| 2009/0272718 A1 | 11/2009 | Fischer |
| 2009/0279989 A1 | 11/2009 | Wong et al. |

(56) References Cited

U.S. PATENT DOCUMENTS

| | | |
|---|---|---|
| 2009/0289179 A1 | 11/2009 | Chen et al. |
| 2009/0311869 A1 | 12/2009 | Okesaku et al. |
| 2010/0000964 A1 | 1/2010 | Chen |
| 2010/0126668 A1 | 5/2010 | Koshiishi et al. |
| 2010/0151694 A1 | 6/2010 | Peuse et al. |
| 2010/0206846 A1 | 8/2010 | Nishimura et al. |
| 2010/0248488 A1 | 9/2010 | Agarwal et al. |
| 2010/0273332 A1 | 10/2010 | Edelberg |
| 2010/0276391 A1 | 11/2010 | Grimbergen et al. |
| 2010/0323508 A1 | 12/2010 | Adibi et al. |
| 2011/0031216 A1 | 2/2011 | Liao et al. |
| 2011/0151673 A1 | 6/2011 | Noda et al. |
| 2011/0177694 A1 | 7/2011 | Chen et al. |
| 2011/0227276 A1 | 9/2011 | Asari et al. |
| 2011/0248634 A1 | 10/2011 | Heil et al. |
| 2012/0021355 A1 | 1/2012 | Kim et al. |
| 2012/0031559 A1 | 2/2012 | Dhindsa et al. |
| 2012/0034786 A1 | 2/2012 | Dhindsa et al. |
| 2012/0104274 A1 | 5/2012 | Hirayanagi et al. |
| 2012/0235273 A1 | 9/2012 | Chen et al. |
| 2012/0247677 A1 | 10/2012 | Himori et al. |
| 2012/0273130 A1 | 11/2012 | Drewery et al. |
| 2012/0298039 A1* | 11/2012 | Peuse ............... H01L 21/0223 118/723 I |
| 2012/0318773 A1 | 12/2012 | Wu et al. |
| 2012/0322011 A1 | 12/2012 | Wu et al. |
| 2012/0322270 A1 | 12/2012 | Long et al. |
| 2013/0059448 A1* | 3/2013 | Marakhtanov ...... H01J 37/32091 438/711 |
| 2013/0168352 A1 | 7/2013 | Fischer |
| 2013/0192759 A1 | 8/2013 | Setsuhara et al. |
| 2014/0054269 A1 | 2/2014 | Hudson et al. |
| 2014/0144876 A1 | 5/2014 | Nakagawa et al. |
| 2014/0251790 A1 | 9/2014 | Kodaira et al. |
| 2014/0302678 A1 | 10/2014 | Paterson et al. |
| 2014/0302680 A1 | 10/2014 | Singh et al. |
| 2014/0302681 A1 | 10/2014 | Paterson et al. |
| 2015/0011093 A1 | 1/2015 | Singh et al. |
| 2015/0017810 A1 | 1/2015 | Guha |
| 2015/0083582 A1 | 3/2015 | Dhindsa et al. |
| 2015/0179465 A1 | 6/2015 | Singh et al. |
| 2015/0206775 A1 | 7/2015 | Hudson et al. |
| 2015/0364339 A1 | 12/2015 | Guha |
| 2015/0364349 A1 | 12/2015 | Guha |
| 2016/0086795 A1 | 3/2016 | Paterson et al. |
| 2016/0141188 A1 | 5/2016 | Singh et al. |
| 2016/0148786 A1 | 5/2016 | Marakhtanov et al. |
| 2016/0181130 A1 | 6/2016 | Singh et al. |
| 2016/0203990 A1 | 7/2016 | Singh et al. |
| 2016/0211156 A1 | 7/2016 | Singh et al. |
| 2016/0358784 A1 | 12/2016 | Hudson et al. |
| 2017/0213747 A9 | 7/2017 | Dhindsa et al. |
| 2017/0250059 A1 | 8/2017 | Fischer |
| 2018/0005852 A1 | 1/2018 | Dhindsa et al. |

FOREIGN PATENT DOCUMENTS

| | | |
|---|---|---|
| CN | 1723529 A | 1/2006 |
| CN | 101076456 A | 11/2007 |
| CN | 101167155 A | 4/2008 |
| CN | 101174107 A | 5/2008 |
| CN | 102190164 A | 9/2011 |
| CN | 102405512 A | 4/2012 |
| CN | 102834905 A | 12/2012 |
| CN | 202633210 U | 12/2012 |
| CN | 103053012 A | 4/2013 |
| CN | 103069547 A | 4/2013 |
| CN | 103140915 A | 6/2013 |
| CN | 102017121 | 11/2013 |
| EP | 0 756 309 A1 | 1/1997 |
| JP | S6260146 A | 3/1987 |
| JP | S62-216329 A | 9/1987 |
| JP | H01-219161 A | 9/1989 |
| JP | H01-302645 A | 12/1989 |
| JP | H02-131550 U | 11/1990 |
| JP | H04137727 A | 5/1992 |
| JP | H04341744 A | 11/1992 |
| JP | H06-089880 A | 3/1994 |
| JP | H07-003453 A | 1/1995 |
| JP | H07235397 A | 9/1995 |
| JP | H07-335618 A | 12/1995 |
| JP | H08-107101 A | 4/1996 |
| JP | H08167596 A | 6/1996 |
| JP | 2604684 B2 | 4/1997 |
| JP | 2643457 B2 | 5/1997 |
| JP | H1041276 A | 2/1998 |
| JP | H10242116 A | 9/1998 |
| JP | H10270429 A | 10/1998 |
| JP | H10-294307 A | 11/1998 |
| JP | H11-54717 | 2/1999 |
| JP | H11-67737 A | 3/1999 |
| JP | H11-111697 A | 4/1999 |
| JP | 2000-208483 | 7/2000 |
| JP | 2000-306884 A | 11/2000 |
| JP | 2001-196352 A | 7/2001 |
| JP | 2001-239153 A | 9/2001 |
| JP | 11-219938 | 11/2001 |
| JP | 2001-332534 A | 11/2001 |
| JP | 2002-503031 A | 1/2002 |
| JP | 2003-533878 A | 11/2003 |
| JP | 2004-153240 A | 5/2004 |
| JP | 2004-281232 A | 10/2004 |
| JP | 2004-349375 | 12/2004 |
| JP | 2005-116865 A | 4/2005 |
| JP | 2005-276931 A | 10/2005 |
| JP | 2006-236772 | 9/2006 |
| JP | 2007-501530 A | 1/2007 |
| JP | 2007-035728 A | 2/2007 |
| JP | 2007-149788 A | 6/2007 |
| JP | 2008-085341 A | 4/2008 |
| JP | 2008-515221 A | 5/2008 |
| JP | 2010512031 A | 4/2010 |
| JP | 2010-192197 | 9/2010 |
| JP | 10-294307 | 11/2010 |
| JP | 2010-541167 A | 12/2010 |
| JP | 2012-054304 A | 3/2012 |
| JP | WO2010/064306 A1 | 5/2012 |
| JP | 2012531520 A | 12/2012 |
| JP | WO2011-007546 A1 | 12/2012 |
| KR | 10-1999-0023520 | 3/1999 |
| KR | 2003-046189 * | 6/2003 |
| KR | 10-2006-0045262 | 5/2006 |
| KR | 2007-0057148 A | 6/2007 |
| KR | 10-0761570 B1 | 9/2007 |
| KR | 2008-0038323 A | 5/2008 |
| KR | 2009-0086638 A | 8/2009 |
| KR | 2001-0062799 A | 7/2011 |
| KR | 10-2011-0104001 | 9/2011 |
| TW | 407300 | 10/2000 |
| TW | I232480 B | 5/2005 |
| TW | 200715362 A | 4/2007 |
| TW | 200841775 A | 10/2008 |
| TW | 200924051 A | 6/2009 |
| TW | 201133605 A | 10/2011 |
| TW | 201145383 A | 12/2011 |
| TW | 201214502 A | 4/2012 |
| TW | 201229299 A | 7/2012 |
| TW | 201250778 A | 12/2012 |
| TW | 201303954 A1 | 1/2013 |
| TW | 201324610 A1 | 6/2013 |
| TW | 201324663 | 6/2013 |
| WO | WO 99/40609 A1 | 8/1999 |
| WO | WO 01/88962 A1 | 11/2001 |
| WO | WO 01/092611 A1 | 12/2001 |
| WO | WO 2004/047157 | 6/2004 |
| WO | WO 2008/036210 A2 | 3/2008 |
| WO | WO 2008/070181 A2 | 6/2008 |
| WO | WO 2008/082518 A2 | 7/2008 |
| WO | WO 2006/129643 A1 | 1/2009 |
| WO | WO 2011/007546 A1 | 1/2011 |
| WO | WO 2012/018448 A2 | 2/2012 |

(56) References Cited

FOREIGN PATENT DOCUMENTS

| WO | WO 2013/036371 A2 | 3/2013 |
|---|---|---|
| WO | WO 2013/065531 A1 | 5/2013 |
| WO | WO 2013/085705 A1 | 6/2013 |

OTHER PUBLICATIONS

U.S. Notice of Allowance, dated Jun. 2, 2016, issued in U.S. Appl. No. 14/832,539.
U.S. Office Action, dated Sep. 21, 2016, issued in U.S. Appl. No. 14/033,241.
U.S. Final Office Action, dated Aug. 25, 2016, issued in U.S. Appl. No. 14/954,586.
U.S. Notice of Allowance, dated Apr. 20, 2016, issued in U.S. Appl. No. 14/676,711.
U.S. Office Action, dated Jul. 5, 2016, issued in U.S. Appl. No. 13/339,312.
U.S. Final Office Action, dated Dec. 16, 2014, issued in U.S. Appl. No. 13/227,404.
U.S. Office Action, dated Apr. 21, 2015, issued in U.S. Appl. No. 13/227,404.
U.S. Final Office Action, dated Nov. 5, 2015, issued in U.S. Appl. No. 13/227,404.
US Examiner's Answer to Appeal Brief [Before the Patent Trial and Appeal Board], dated Oct. 20, 2016, issued in U.S. Appl. No. 13/227,404.
Chinese First Office Action dated Feb. 2, 2016 issued in CN Application No. 201410138510.5.
Chinese Second Office Action dated Jul. 28, 2016 issued in CN Application No. 201410138510.5.
Chinese Second Office Action dated Jul. 22, 2016 issued in CN Application No. 201410138310.X.
Chinese First Office Action dated Sep. 26, 2016 issued in CN Application No. 201410482626.0.
Chinese First Office Action dated Jun. 3, 2016 issued in Application No. CN 201410138060.X.
Chinese First Office Action dated Sep. 17, 2015 issued in CN Application No. 2013-10379780.0.
Chinese Second Office Action dated May 17, 2016 issued in CN Application No. 2013-10379780.0.
PCT International Search Report dated Nov. 2, 2012 issued in PCT/US2012/051460.
PCT International Preliminary Report on Patentability and Written Opinion dated Apr. 10, 2014 issued in PCT/US2012/051460.
Chinese First Office Action dated Mar. 28, 2016 issued in CN Application No. 201410323125.8.
U.S. Patent Application entitled "Dual Chamber Plasma Etcher With Ion Accelerator ," Guha, U.S. Appl. No. 14/832,538, filed Aug. 21, 2015.
U.S. Patent Application entitled "Dual Chamber Plasma Etcher With Ion Accelerator," Guha, U.S. Appl. No. 14/832,539, filed Aug. 21, 2015.
U.S. Office Action, dated May 8, 2015, issued in U.S. Appl. No. 13/916,318.
U.S. Notice of Allowance, dated Oct. 7, 2015, issued in U.S. Appl. No. 13/916,318.
U.S. Office Action, dated Feb. 10, 2015, issued in U.S. Appl. No. 13/939,709.
U.S. Notice of Allowance, dated May 21, 2015, issued in U.S. Appl. No. 13/939,709.
US Examiner's Amendment Communication, dated Jun. 26, 2015, issued in U.S. Appl. No. 13/939,709.
U.S. Notice of Allowance, dated Jan. 16, 2015, issued in U.S. Appl. No. 13/936,930.
U.S. Notice of Allowance, dated Oct. 2, 2015, issued in U.S. Appl. No. 14/637,260.
U.S. Office Action, dated May 15, 2015, issued in U.S. Appl. No. 14/184,491.
U.S. Notice of Allowance, dated Aug. 28, 2015, issued in U.S. Appl. No. 14/184,491.
U.S. Office Action, dated Oct. 11, 2013, issued in U.S. Appl. No. 13/626,793.
U.S. Final Office Action, dated Feb. 13, 2014, issued in U.S. Appl. No. 13/626,793.
U.S. Office Action, dated Jul. 16, 2014, issued in U.S. Appl. No. 13/626,793.
U.S. Notice of Allowance, dated Jan. 2, 2015, issued in U.S. Appl. No. 13/626,793.
U.S. Office Action, dated Oct. 1, 2015, issued in U.S. Appl. No. 14/676,711.
U.S. Office Action, dated May 21, 2014, issued in U.S. Appl. No. 13/227,404.
Chinese First Office Action [no translation] dated Sep. 17, 2015 issued in CN Application No. 2013-10379780.0.
Suda et al., (2012) "Development of Cu Etching Using $O_2$ Cluster Ion Beam under Acetic Acid Gas Atmosphere", *Japanese Journal of Applied Physics*, 51:08HA02-1-08HA02-5.
Wolf, S. and R.N. Tauber, R.N. (2000) "Silicon Processing for the VLSI Era," *Lattice Press*, ISBN 0-9616721-6-1, 1:672.
Wolf, S. and R.N. Tauber, R.N. (2000) "Silicon Processing for the VLSI Era," Chapter 14, Dry Etching for ULSI Fabrication, *Lattice Press*, ISBN 0-9616721-6-1, 1:673-676.
Xiao, (2001) "Introduction to Semiconductor Manufacturing Technology", *Published by Prentice Hall*, ISBN 0-13-022404-9, Chapter 7, p. 230.
U.S. Final Office Action dated Jun. 12, 2017, issued in U.S. Appl. No. 14/082,009.
U.S. Office Action dated Jan. 25, 2018, issued in U.S. Appl. No. 14/082,009.
U.S. Notice of Allowance, dated Jul. 13, 2017, issued in U.S. Appl. No. 14/033,241.
U.S. Notice of Allowance [Corrected Notice of Allowance], dated Sep. 20, 2017, issued in U.S. Appl. No. 14/033,241.
U.S. Office Action dated Jan. 11, 2018, issued in U.S. Appl. No. 15/237,521.
Taiwanese First Office Action dated Jan. 19, 2018 issued in Application No. TW 103112593.
Japanese Office Action dated Feb. 27, 2018 issued in Application No. JP 2014076598.
Chinese First Office Action dated Apr. 5, 2016 issued in Application No. CN 201410330530.2.
Singapore Examination Report dated Sep. 18, 2017 issued in Application No. SG 10201403999Y.
Taiwan First Office Action dated Feb. 6, 2018 issued in Application No. TW 103123849.
Chinese Second Office Action dated May 22, 2017 issued in Application No. CN 201410482626.0.
Chinese Third Office Action dated Dec. 4, 2017 issued in Application No. CN 201410482626.0.
Taiwanese First Office Action dated Nov. 1, 2017 Application No. TW 103123364.
Japanese First Office Action dated Jan. 23, 2018 issued in Application No. JP 2014-077139.
Singapore Notice of Allowance & Supplementary Examination Report dated Dec. 7, 2017.
Taiwan Examination and Search Report dated Aug. 14, 2017 issued in Application No. TW 103112372.
Japanese Office Action [Notification of Reasons(s) for Rejection] dated Jun. 13, 2017 issued in Application No. JP 2013-174444.
Japanese Office Action [Decision of Rejection] dated Feb. 6, 2018 issued in Application No. JP 2013-174444.
Japanese Office Action [Notification of Reasons for Rejection] dated Aug. 9, 2016 issued in Application No. JP 2014-529751.
U.S. Patent Application entitled "Internal Plasma Grid for Semiconductor Fabrication," Singh et al., U.S. Appl. No. 15/055,439, filed Feb. 26, 2016.
U.S. Patent Application entitled "Internal Plasma Grid for Semiconductor Fabrication," Singh et al., U.S. Appl. No. 15/055,380, filed Feb. 26, 2016.
U.S. Office Action, dated Mar. 10, 2016, issued in U.S. Appl. No. 14/832,539..

(56) References Cited

OTHER PUBLICATIONS

U.S. Office Action, dated Feb. 17, 2016, issued in U.S. Appl. No. 14/954,586.
Chinese First Office Action [no translation] dated Feb. 2, 2016 issued in CN Application No. 201410138510.5.
Chinese First Office Action dated Jan. 28, 2016 issued in CN Application No. 201410138310.X.
Chinese First Office Action dated Apr. 5, 2016 issued in CN Application No. 201410330530.2.
Japanese First Office Action dated Feb. 6, 2018 issued in Application No. JP 2014-076868.
Japanese First Office Action [Notice of Reasons for Refusal] dated Apr. 3, 2018 issued in Application No. JP 2014-138340.
Japanese First Office Action dated Apr. 3, 2018 issued in Application No. JP 2014138330.
Singapore Notice of Allowance & Supplementary Examination Report dated Mar. 22, 2018 issued in Application No. SG 10201403639P.
U.S. Patent Application entitled "Ion Beam Etching System," Singh et al., U.S. Appl. No. 14/996,656, filed Jan. 15, 2016.
U.S. Patent Application entitled "Internal Plasma Grid Applications for Semiconductor Fabrication," Paterson et al., U.S. Appl. No. 14/954,586, filed Nov. 20, 2015.
U.S. Office Action, dated Jan. 14, 2015, issued in U.S. Appl. No. 13/916,318.
U.S. Office Action dated Dec. 1, 2016, issued in U.S. Appl. No. 14/082,009.
U.S. Notice of Allowance, dated Dec. 29, 2016, issued in U.S. Appl. No. 14/954,586.
U.S. Final Office Action, dated Feb. 13, 2017, issued in U.S. Appl. No. 13/339,312.
Chinese Third Office Action dated Jan. 19, 2017 issued in CN Application No. 201410138310.X.
Singapore Search and Examination Report dated Dec. 8, 2016 issued in SG 10201403999Y.
Chinese Second Office Action dated Oct. 28, 2016 issued in CN Application No. 201410323125.8.
Chinese Second Office Action dated Jan. 18, 2017 issued in Application No. CN 201410138060.X.
Chinese Third Office Action dated Nov. 15, 2016 issued in CN Application No. 2013-10379780.0.
Taiwanese Notice of Allowance and Search Report dated Nov. 30, 2016 issued in TW 102130651.
Taiwanese Examination Report dated Mar. 3, 2017 issued in TW 105142615.
U.S. Notice of Allowance, dated Oct. 15, 2018, issued in U.S. Appl. No. 15/055,439.
U.S. Final Office Action, dated Nov. 27, 2018, issued in U.S. Appl. No. 15/055,380.
U.S. Final Office Action dated Nov. 1, 2018 issued in U.S. Appl. No. 15/594,572.
Japanese Second Office Action dated Nov. 7, 2018 issued in Application No. JP 2014-076868.
Chinese First Office Action dated Dec. 3, 2018 issued in Application No. CN 201710568823.8.
Taiwanese First Office Action dated Nov. 7, 2018 issued in Application No. TW 107120262.
Japanese Second Office Action dated Nov. 13, 2018 issued in Application No. JP 2014-076598.
U.S. Final Office Action dated Jul. 26, 2018, issued in U.S. Appl. No. 14/082,009.
U.S. Final Office Action dated Sep. 14, 2018, issued in U.S. Appl. No. 14/082,009.
U.S. Office Action, dated Jun. 15, 2018, issued in U.S. Appl. No. 15/055,439.
U.S. Office Action, dated May 17, 2018, issued in U.S. Appl. No. 15/055,380.
U.S. Notice of Allowance, dated Jul. 11, 2018, issued in U.S. Appl. No. 14/832,538.
U.S. Office Action dated Jul. 5, 2018 issued in U.S. Appl. No. 15/594,572.
U.S. Final Office Action dated Aug. 13, 2018 issued in U.S. Appl. No. 15/237,521.
Taiwanese First Office Action dated May 16, 2018 issued in Application No. 103112591.
Japanese Second Office Action [Decision of Refusal] dated Sep. 11, 2018 issued in Application No. JP 2014-138340.
Japanese Office Action dated Jun. 5, 2018 issued in Application No. JP 2014-184979.
Taiwan Office Action dated May 8, 2018 issued in Application No. TW 103132489.
Chinese First Office Action dated Aug. 24, 2018 issued in Application No. CN 201710479405.1.
Japanese Second Office Action [Reasons for Refusal] dated Sep. 11, 2018 issued in Application No. JP 2014-077139.
Chinese First Office Action dated Aug. 3, 2018 issued in Application No. CN 201710574814.X.
U.S. Office Action dated Mar. 21, 2019 issued in U.S. Appl. No. 13/227,404.
Japanese Second Office Action dated Mar. 5, 2019 issued in Application No. JP 2014-184979.
Chinese Second Office Action dated May 8, 2019 issued in Application No. CN 201710479405.1.
Japanese Notice of Allowance dated Dec. 17, 2018 issued in Application No. JP 2014-138330.
Japanese Decision to Grant dated Mar. 12, 2019 issued in Application No. JP 2014-077139.
U.S. Office Action dated Jan. 3, 2020 issued in U.S. Appl. No. 15/702,541.
U.S. Office Action dated Jul. 2, 2020 issued in U.S. Appl. No. 15/702,541.
U.S. Final Office Action dated Sep. 18, 2019 issued in U.S. Appl. No. 13/227,404.
U.S. Office Action dated Dec. 31, 2019 issued in U.S. Appl. No. 13/227,404.
Chinese Second Office Action dated Aug. 26, 2019 issued in Application No. CN 201710568823.8.
Chinese First Office Action dated Aug. 28, 2019 issued in Application No. CN 201611043375.1.
Chinese Notice of Allowance dated May 29, 2020 issued in Application No. CN 201611043375.1.
Japanese Decision to Grant dated Dec. 3, 2019 issued in Application No. JP 2014-184979.
Korean First Office Action dated Dec. 19, 2019 issued in Application No. KR 10-2013-0102027.
Korean First Office Action dated Jul. 14, 2020 issued in Application No. KR 2014-0041261.
Korean First Office Action dated Jul. 14, 2020 issued in Application No. KR 10-2014-0041352.
Korean First Office Action dated Jul. 30, 2020 issued in Application No. KR 2014-0087285.
Korean Second Office Action dated Sep. 25, 2020 issued in Application No. KR 10-2013-0102027.
Korean Decision for Grant of Patent dated Mar. 28, 2021 issued in Application No. KR 2014-0041261.
Korean Decision for Grant of Patent dated Apr. 28, 2021 issued in Application No. KR 10-2014-0041352.
Korean Decision for Grant of Patent dated Apr. 19, 2021 issued in Application No. KR 2014-0087285.
Korean Decision for Grant of Patent dated Apr. 26, 2021 issued in Application No. KR 10-2013-0102027.

* cited by examiner

INTERNAL PLASMA GRID FOR SEMICONDUCTOR FABRICATION

CROSS-REFERENCE TO RELATED APPLICATIONS

This application is a continuation of and claims priority to U.S. application Ser. No. 13/916,318, titled "INTERNAL PLASMA GRID FOR SEMICONDUCTOR FABRICATION," filed Jun. 12, 2013, which claims the benefit of U.S. Provisional Application No. 61/809,246, titled "INTERNAL PLASMA GRID FOR SEMICONDUCTOR FABRICATION," filed Apr. 5, 2013, all of which are incorporated herein by this reference for all purposes.

BACKGROUND

One operation frequently employed in the production of semiconductors is an etching operation. In an etching operation, one or more materials are partly or wholly removed from a partially fabricated integrated circuit. Plasma etching is often used, especially where the geometries involved are small, high aspect ratios are used, or precise pattern transfer is needed.

Typically, a plasma contains electrons, as well as positive and negative ions, and some radicals. The radicals, positive ions, and negative ions interact with a substrate to etch features, surfaces and materials on the substrate. In etching conducted with an inductively coupled plasma source, a chamber coil performs a function analogous to that of a primary coil in a transformer, while the plasma performs a function analogous to that of a secondary coil in the transformer.

With the move from planar to 3D transistor structures (e.g., FinFET gate structures for logic devices), plasma etching processes need to be increasingly precise and uniform in order to produce quality products. Among other factors, the plasma etch processes should have good selectivity, profile angle, Iso/Dense loading, and overall uniformity.

It is beneficial for an etching process to have good selectivity between the material that is etched and the material that is retained. In the context of the FinFET gate structure, this means that there should be good selectivity of the gate being etched to other exposed components such as a silicon nitride mask. The profile angle is measured as the angle between a recently etched (roughly vertical) sidewall and a horizontal plane. In many applications, the ideal profile angle is 90 degrees, producing a vertical etched step or opening. Sometimes, the local on-wafer feature density can affect the etching process. For example, an area of the wafer where features are dense may etch somewhat differently (e.g., etch more quickly, more slowly, more isotropically, more anisotropically, etc.) as compared to an area of the wafer where features are more isolated. The differences which arise due to variations in feature density are referred to as Iso/Dense loading (I/D loading). It is beneficial to minimize these differences during fabrication. In addition to meeting these and potentially other device-specific requirements, the etching process often needs to be consistently executed over the entire face of a substrate (e.g., the etch conditions and results should be uniform from the center to the edge of a semiconductor wafer).

It has been found difficult to achieve multiple objectives such as those set forth above when etching advanced structures such as FinFET gates.

SUMMARY

Disclosed herein is an apparatus used in etching semiconductor substrates and layers formed thereon during the manufacture of semiconductor devices. In one aspect of the embodiments herein, an apparatus for etching a feature on a substrate is provided. The apparatus may include a chamber defining an interior where a plasma can be provided; a substrate holder for holding a substrate in the chamber during etching; a plasma generator for producing a plasma within the chamber; and a grid assembly dividing the interior of the plasma chamber into an upper sub-chamber proximate the plasma generator and a lower sub-chamber proximate the substrate holder, where the upper sub-chamber has a height that is at least about ⅙ that of the lower sub-chamber, and where the grid assembly includes two or more grids having a plurality of slots that substantially prevent formation of induced current in the grid when the plasma is produced within the chamber.

The apparatus may also include a controller designed or configured to produce the plasma in the chamber under conditions that produce an upper zone plasma in the upper sub-chamber and a lower zone plasma in the lower sub-chamber. In some embodiments, the effective electron temperature in the lower zone plasma is about 1 eV or less, and is less than the effective electron temperature in the upper zone plasma. In some embodiments, the electron density in the lower zone plasma is about $5 \times 10^9$ cm$^{-3}$ or less, and is less than the electron density in the upper zone plasma. The controller may also be designed or configured to apply a bias to one or more grids of the grid assembly and/or to the substrate holder. The controller may also be designed or configured to deliver an etchant gas to the chamber. In certain cases, the controller is designed or configured to provide a pressure of less than about 2000 mTorr in the chamber while the plasma etches the substrate. In certain cases, however, the controller is designed or configured to provide a lower pressure in the chamber during etching, such as a pressure less than about 200 mTorr. In other cases, the controller may be designed or configured to maintain a pressure in the reaction chamber between about 1-20 mTorr, or between about 5-20 mTorr. The controller may also be designed or configured to provide a combination of conditions within the apparatus that produce an ion-ion plasma in the lower sub-chamber.

In certain embodiments, at least one grid of the grid assembly may have an average thickness of between about 1-50 mm, or between about 5-20 mm. In certain embodiments, the sum of thicknesses of the grids in the assembly is between about 2 and 50 mm. In some cases, the slots are radially directed or roughly radially directed. The slots in at least one grid of the grid assembly may have an aspect ratio between about 0.01-5. In some embodiments the aspect ratio of the slots is between about 0.3-5, between about 0.5-2, or between about 1-4. The slots are often arranged such that they extend roughly radially outwards. Azimuthally adjacent slots are sometimes separated by at least about 15°. In these or other cases, azimuthally adjacent slots may be separated by no more than about 60°.

The plasma generator in certain embodiments includes a coil disposed above a ceiling of the chamber. In some embodiments, the substrate holder is an electrostatic chuck. Various other elements may be included in the apparatus. For example, the apparatus may also include a process gas inlet. Furthermore, the apparatus may include a vacuum connection.

In a particular embodiment, the plasma grid assembly includes a first grid and a second grid. The first and second grid may have slots that are substantially identical, or they may have slot shapes and/or layouts that are different between the two grids. At least one of the first and second grids may be rotatable with respect to the other grid. This rotation may occur about an axis normal to an upper surface of the substrate holder. In certain implementations, the first and second grid may have slot patterns allowing plasma conditions in the lower sub-chamber to be radially tuned. In these or other implementations, at least one of the grids may be movable such that the distance between the first and second grids is variable. The aspect ratio of the assembly slots may be between about 0.1-5 in certain embodiments.

In another aspect of the embodiments herein, a method is provided for etching a feature on a substrate, including providing the substrate to a substrate holder in a chamber with a plasma generator and a grid assembly dividing the interior of the plasma chamber into an upper sub-chamber proximate the plasma generator and a lower sub-chamber proximate the substrate holder, where the grid assembly has at least two grids, and where the upper sub-chamber has a height that is at least about ⅙ that of the lower sub-chamber; generating a plasma in the chamber under conditions that produce an upper zone plasma in the upper sub-chamber and a lower zone plasma in the lower sub-chamber; etching the feature in the substrate by interaction of the lower zone plasma with the substrate. In some such methods, the effective electron temperature in the lower zone plasma is about 1 eV or less, and is less than the effective electron temperature in the upper zone plasma. In some embodiments, the electron density in the lower zone plasma is about $5 \times 10^9$ cm$^{-3}$ or less, and is less than the electron density in the upper zone plasma.

In some cases, substantially no current is generated in the grids of the grid assembly when generating the plasma. The method may also include applying a bias to the grid, and/or applying a bias to the substrate holder. In certain embodiments, the method also includes providing an etchant gas to the chamber. The etching may be performed at a chamber pressure of less than about 2000 mTorr, and in some cases the etching is performed at a chamber pressure between about 1-200 mTorr, or between about 1-20 mTorr, or between about 5-20 mTorr. The lower zone plasma may be an ion-ion plasma, as described herein.

The method may also include rotating at least one grid of the grid assembly. In these or other implementations, the method may also include changing a distance between the grids along a central axis in the grid assembly. Typically, though not necessarily, rotational and/or translational adjustments such as these are performed prior to beginning to etch a particular layer of a partially fabricated semiconductor device or other structure. In certain implementations, however, these adjustments may be made during the etching process.

These and other features will be described below with reference to the associated drawings.

DETAILED DESCRIPTION

Figure 1:
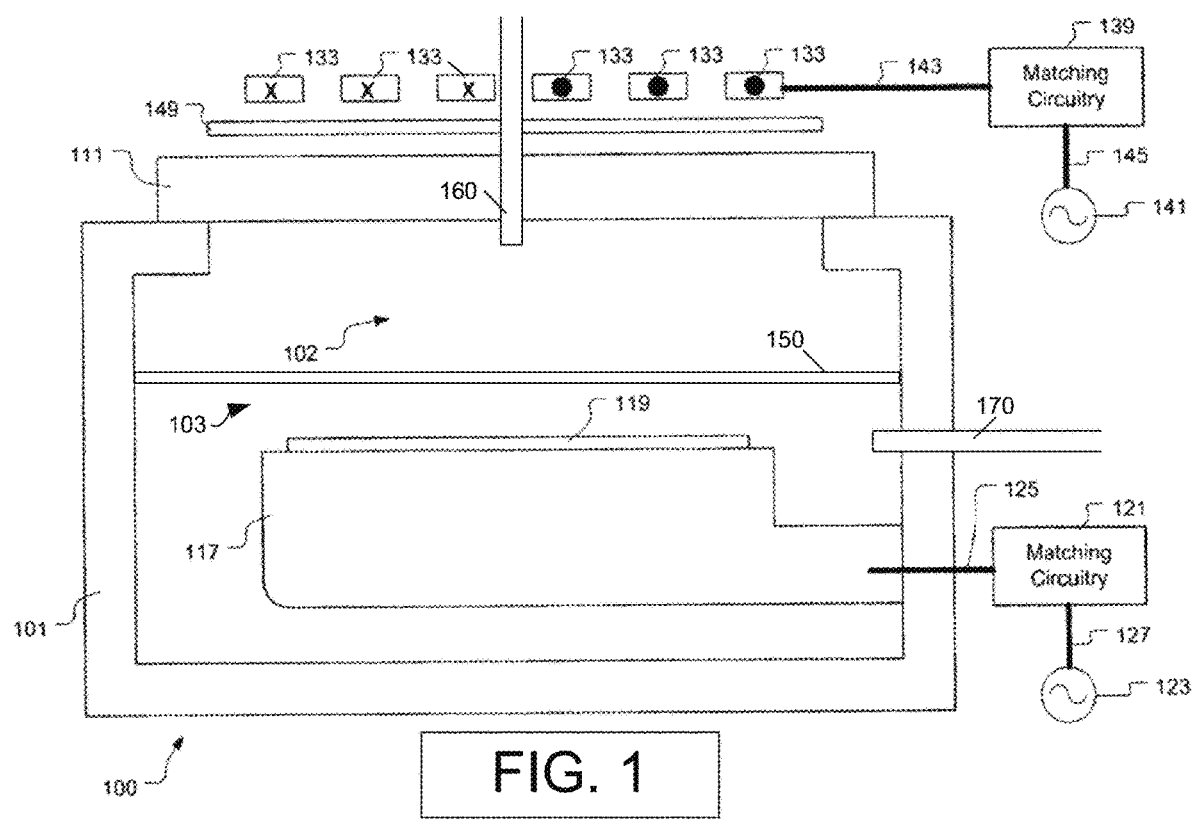
FIG. 1 is a schematic cross-sectional diagram illustrating a plasma processing system utilized for etching operations in accordance with certain embodiments disclosed herein.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to devices on a semiconductor wafer during any of various stages of integrated circuit fabrication thereon. The following detailed description assumes the invention is implemented on a wafer. However, the invention is not so limited. The work piece may be of various shapes, sizes, and materials.

In the following description, numerous specific details are set forth in order to provide a thorough understanding of the presented embodiments. The presented embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Disclosed is an apparatus used in etching semiconductor substrates and layers formed thereon during the manufacture of semiconductor devices. The apparatus is defined by a chamber in which etching is performed. In certain embodiments, the chamber includes a planar window, a generally planar excitation coil, and a pedestal or chuck for holding the semiconductor substrate during etching. Of course, this disclosure is not limited to any particular type of plasma source. In addition to planar excitation coils, dome and plate plasma sources may be employed. Sources include inductively coupled plasma sources, capacitively coupled plasma sources, and others known to those of skill in the art. The embodiments herein utilize a grid positioned within the chamber that separates the chamber into two sub-chambers. In various embodiments, a collection of two or more stacked grids, sometimes referred to as a "grid assembly" is used. During operation, each sub-chamber contains a plasma having distinct properties. Plasma is primarily or exclusively generated in the upper sub-chamber, and certain species are able to pass unaffected through the grid or grid assembly into the lower sub-chamber. The grid has slots, which penetrate the thickness of the grid. In certain implementations, these slots extend roughly radially outward. As used herein, "extending roughly radially outwards" means that the feature being discussed has at least some radially directed component. In other words, the entire feature need not be overall radially directed, so long as there is some part of the feature that extends in a generally center-to-edge direction. Further, the "center-to-edge direction" is defined to include a range of angles around the true center-to-edge direction (e.g., within about 20° of the true center-to-edge direction).

The grid or grid assembly may contain multiple radial slots that penetrate the thickness of the grid. The grid and slots are designed such that only a fraction of high energy electrons in the upper sub-chamber may pass through the grid. Collectively, the higher energy electrons generally become lower energy "colder" electrons upon passing through the grid and entering the lower sub-chamber. While high energy electrons may have sufficient energy to pass through the grid, many of them approach the grid at an angle at which they collide with the grid and lose energy. The high energy electrons that do make it through the grid do not have enough energy collectively to sustain the plasma underneath grid because they are now isolated from the excitation source. The mechanisms for the hot electrons to become cold in the lower chamber include collision with the grid, collisions with neutral species under the grid and shielding of the electrons under the grid from the excitation source above the grid. Thus, the grid may produce a plasma in the lower sub-chamber having a low electron density ($n_e$) and low average effective electron temperature ($T_e$). Above the grid or grid assembly, the plasma is typically a conventional electron-ion plasma, in which a very large fraction of the negatively charged species are electrons. Below the grid or grid assembly, the plasma contains a much higher percentage of negative ions and in fact may be an ion-ion plasma. Certain characteristics of an ion-ion plasma are described below. Generally, as compared to the electron-ion plasma, the ion-ion plasma contains a significantly higher proportion of negatively charged species that are ions (rather than electrons).

Position of the Grid within the Reactor

The grid or grid assembly is positioned inside the plasma chamber, thereby separating the chamber into an upper sub-chamber and a lower sub-chamber. An example of a chamber suitable for modification to include a grid as described herein is a Kiyo Reactor from Lam Research Corporation of Fremont, Calif. For context, the following description may be considered with reference to FIG. 1, which is further described below. In certain implementations, the grid is positioned between about 1-6 inches above the interior base of the reaction chamber, or between about 1-6 inches (e.g., between about 1.5-3 inches) above a substrate supporter such as a pedestal. In these or other implementations, the grid may be positioned between about 1-6 inches (e.g., between about 1.5-3 inches) below the interior ceiling of the reaction chamber. The ceiling is often outfitted with a dielectric window.

In certain embodiments, the heights of the upper and lower sub-chambers are substantially the same (e.g., within about 5%), while in other embodiments these heights may differ more considerably. The ratio of the height of the upper chamber to the height of the lower chamber ($h_u/h_l$), also referred to as the sub-chamber height ratio, may be between about 0.1-10, or between about 0.2-5. In some embodiments, the sub-chamber height ratio is greater than about ⅙.

The grid should not be positioned too close to the wafer, as this may cause printing of the grid to occur on the wafer's face. In other words, the pattern of slots in the grid may undesirably appear on the face of the wafer after processing, causing severe etch non-uniformity on the substrate surface. For many applications, a separation distance of at least about 1 inch from the top of the substrate to the grid is sufficient.

The Grid Design

Various designs may be used to implement the grid. In some embodiments, the grid is a fairly simple thin sheet of material having slots, generally circular holes, or other perforations allowing some electrons to pass from the upper sub-chamber to the lower sub-chamber. In other embodiments, the grid may consist of a more complex grid assembly having multiple components. For example, the grid assembly may have multiple grids, support elements and/or movement causing elements.

In a simple implementation, the grid is a relatively thin sheet having slots. Additionally, in some embodiments, the grid may include holes. Thus, the grid includes holes and slots in combination. Non-limiting examples of grid structures are shown in FIGS. 2A-2B and 3A-3D. The material contained in the grid may be an insulator, conductor, or some combination thereof. In certain implementations, the grid contains one or more materials including, but not limited to, metals, metallic alloys such as stainless steel, aluminum, titanium, ceramic, silicon, silicon carbide, silicon nitride, and a combination thereof. The material may or may not be anodized or otherwise passivated for, e.g., corrosion resistance. In one embodiment, the grid is made from a metallic material having a ceramic coating. Other coatings may also be used. The use of a coated grid is especially beneficial where the layers being etched are volatile. In certain implementations, a grid may be coated with a pure coating including, but not limited to, coatings of $Y_2O_3$, $YF_3$, YAG, titanium nitride, or $CeO_2$, for example. Further, the grid may be grounded, floating or biased. In some implementations, a grounded grid acts as an enhanced bias current return for the cathode.

The grid generally spans an entire horizontal cross-section of the chamber. Where the chamber is circular (as viewed from above), the grid will also be circular. This allows the grid to effectively divide the reaction chamber into two sub-chambers. In certain designs, the circular shape of the grid is defined by to the geometry of the substrate, which is typically a circular wafer. As is well known, wafers typically are provided in various sizes, such as 200 mm, 300 mm, 450 mm, etc. Other shapes are possible for square or other polygonal substrates or smaller substrates, depending on the etching operations performed within chamber. Thus, the cross-section of the grid may have a variety of shapes and sizes. A flat planar grid cross-section is appropriate for some embodiments. However, dished, domed, oscillating (e.g., sinusoidal, square wave, chevron shapes), slanted, etc. grid cross-sections are appropriate in other embodiments. The slots or holes through any of these cross-sectional profiles will have characteristics (including aspect ratios as described elsewhere herein).

The grid may on average be between about 1-50 mm thick, preferably between about 5-20 mm thick. If the grid is too thick, it may not function correctly (e.g., it may block too many species from getting through, have too much mass, take up too much space in the reaction chamber, etc.). If the grid is too thin, it may not be able to withstand the plasma processing, and may need to be replaced fairly often. Typically, the thickness of the grid is also limited by the desired aspect ratio of the slots in the grid, as the height of the slots is determined by the grid thickness, as described below.

In some embodiments, the grid functions as a separator between an upstream and a downstream plasma, where the downstream plasma exists in the lower sub-chamber and may be radical rich. In this manner, a plasma chamber outfitted with a grid may produce a result similar to that accomplished with existing remote plasma tools such as the GAMMA™ platform tools available from Novellus Systems, now Lam Research Corporation of Fremont, Calif. When operated for this purpose, the grid may be relatively thick, e.g., about 20-50 mm thick.

In certain embodiments, the grid includes slots that have a long, thin shape. The slots extend radially outwards from the center of the grid. The slots have a height, width and length (the width and length are explicitly labeled in FIG. 2A). The slot height is measured along an axis perpendicular to the face of the grid (i.e., the slot height is oriented vertically in most operating configurations), and this height is generally equal to the thickness of the grid. The width of the slots may be variable or constant over the radial extent of the slots. In certain cases, the slots may be pie-shaped (i.e., thinner towards the center and thicker towards the edge of the grid). In various embodiments, the slots extend length-wise outwards from the center of the grid (i.e., radially). In some embodiments, the slot widths are no greater than about 25 mm. The length of the slots may be variable or constant around the azimuthal extent of the grid. The angular separation of the radial slots may be variable or constant around the grid.

If no slots were present in the grid, a current would be induced in the grid during plasma generation. This current would flow substantially circularly around the grid or would form local eddy currents, and would result in increased power consumption. However, the presence of the slots prevents such parasitic current from forming, thereby saving power and resulting in a more efficient process. Openings having shapes such as substantially circular holes are less effective in preventing this current from forming. However, as mentioned, circular openings may be used in conjunction with slotted openings.

The aspect ratio of a slot is defined as the ratio of the slot's height to its width (h/w). Typically, the geometry of this aspect ratio will be viewable as a cross-section taken perpendicular to the lengthwise direction of the slot (often radial). Because the width of the slots may be variable, the aspect ratio may be similarly variable. In certain embodiments, the slots' aspect ratio (which may be variable or constant throughout the grid) is between about 0.01-5, or between about 0.3-5, or between about 1-4, or between about 0.5-2. In many embodiments, grids having these aspect ratios reduce the electron density and effective electron temperature in the lower sub-chamber, as compared to the upper sub-chamber. As mentioned, it is believed that the effective electron temperature is reduced as electrons pass through the slots at least in part because a number of hot electrons are colliding with the grid. Further, the effective electron temperature in the lower sub-chamber is reduced compared to the upper sub-chamber because the electrons in the lower sub-chamber are shielded by the grid and therefore are not subject to inductive heating from the plasma coils (or other plasma source).

When holes are employed together with slots, the holes may serve the same purposes as the slots. Therefore they will generally have aspect ratios as set forth above. In some embodiments, the holes have a diameter in the range of about 0.05 inches to about 0.2 inches. They penetrate the full thickness of the grid.

An additional benefit provided by the grid is that it may neutralize convective flow effects from the main injector. This allows for a more uniform gas flow onto the face of the wafer. The presence of a grid or grid assembly between the wafer and the gas injector(s) in the upper chamber can significantly reduce the convective impact of any gas delivered out of the gas injector(s) because the grid will disrupt the gas flow and result in a more diffusive flow regime over the wafer.

In some embodiments, the grid contains gas delivery holes. In such embodiments, the grid may serve the additional purpose of being a showerhead for the upper and/or lower sub-chambers. In these embodiments, one or more channels may be included in one or more grids. These channels may be fed with gas from an inlet (or multiple inlets), and deliver the gas to a plurality of outlet holes in the grid(s). The outlet holes may form gas distribution showerheads that deliver process gasses to either or both of the upper and lower sub-chambers.

In some implementations, the grid has a region such as a central region containing a feature for allowing a probing apparatus to be disposed through the grid. The probing apparatus can be provided to probe process parameters associated with the plasma processing system during operation. Probing processes can include optical emission endpoint detection, interferometric endpoint detection, plasma density measurements, ion density measurements, and other metric probing operations. In certain embodiments, the central region of the grid is open. In other embodiments, the central region of the grid contains an optically clear material (e.g., quartz, sapphire, etc.) to allow light to be transmitted through the grid.

In certain embodiments, it may be preferable to have a slot in the grid about every 15 mm to 40 mm near the outer edge of the grid for a 300 mm wafer etcher. This corresponds to azimuthally adjacent slots being separated by about 18°, or about 48°, respectively. As such, in certain embodiments, azimuthally adjacent slots are separated by at least about 10°, or at least about 15°. In these or other embodiments, azimuthally adjacent slots are separated by no more than about 40°, or no more than about 50°, or no more than about 60°.

In some embodiments, the plasma grid may include cooling channels embedded in the grid, and these cooling channels may be filled with a flowing or non-flowing coolant material. In certain embodiments, the cooling material is a fluid such as helium or other inert gas or a liquid such as DI water, process cooling water, fluoroinert, or a refrigerant such as perfluorocarbons, hydrofluorocarbons, ammonia and $CO_2$. In these or other embodiments, the plasma grid may include embedded heating elements and/or a temperature measurement device. The cooling channels and embedded heaters allow for precise temperature control, which permit close control over the particle and wall conditions. This control may be used to tune the conditions in the lower zone plasma, in certain cases. For example, where the plasma grid is maintained at a cooler temperature, etch byproducts from the wafer will preferentially deposit on the grid, thereby reducing the gas phase density of the etch byproducts in the lower sub-chamber. Alternatively, the grid or grid assembly may be maintained hot (e.g., above 80° C.) to reduce the deposition on the grid and ensure that the chamber can remain relatively clean and/or reduce the time required to clean the chamber during waferless auto clean (WAC).

Another feature which may be included in certain embodiments is that the grid may act as a showerhead for delivering process gases to either or both of the upper and lower sub-chambers. As such, the grid may contain a plurality of channels which connect a gas supply source with the upper and/or lower sub-chambers. The showerhead holes may be arranged to provide uniform gas delivery into the sub-chambers.

Further, in certain embodiments, more than one gas supply source is used. For example, different process gases may be delivered to the upper and lower sub-chambers (either through one or more showerhead-type grids or by other gas delivery means). In a particular implementation, an inert gas is delivered to the upper sub-chamber, and plasma etching chemistry is delivered to the lower sub-chamber. In some other embodiments, the gas delivered to the upper sub-chamber is $H_2$, $N_2$, $O_2$, $NF_3$, or $C_4F_8$ or another fluorocarbon, though the embodiments are not so limited. In these or other implementations, the gas delivered to the lower sub-chamber may be $N_2$, $CO_2$, or $CF_4$ or another fluorocarbon, though again, the embodiments are not so limited.

It is sometimes useful to have a plasma processing reactor allowing a wide range of plasma conditions adjacent to the work substrate. Such conditions include the plasma density, the effective electron temperature in the plasma, and the ratio of electrons to ions in the plasma. For in situ processing, where multiple layers are being processed in a chamber, it may be necessary to change the processing conditions for each layer. A fixed position grid may limit the operating window of the reactor, e.g. high plasma density may not be achievable if the grid is optimized for producing an ion-ion plasma in the lower sub-chamber. Therefore, certain embodiments provide grids and grid assemblies in which grid line of sight open area is tunable by rotation and/or translation.

In certain embodiments, the plasma grid can be raised or lowered with respect to the plasma coils or other plasma source. This may be accomplished by mounting the grid on a movable stage, for example. In some implementations, the vertical movement allows an operator or controller to change the effective electron temperature, the electron or plasma density, the ratio of electrons to ions, the concentration of radicals, etc. in the upper and lower zone plasmas. Further, because the concentration of radicals is affected by the height of the plasma grid, the use of a movable plasma grid allows for a process where the concentration of radicals is tunable throughout a multi-stage process. As radical species are chemically reactive and negative ions have different etch properties than electrons, this parameter is especially useful to tune/control to achieve a desired reaction.

Figure 3A:
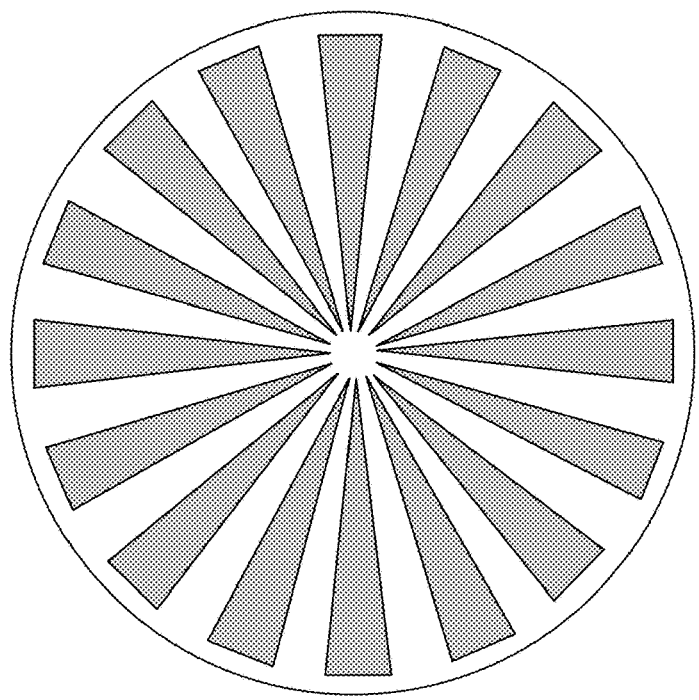
FIGS. 3A-3B illustrate a pair of plasma grids that may be used to radially tune plasma conditions in the lower sub-chamber.
Figure 3B:
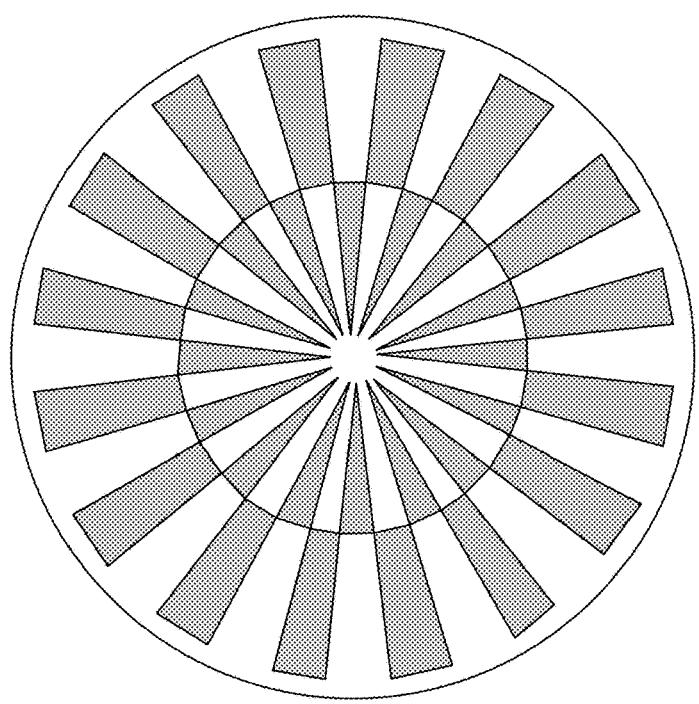

Furthermore, in some implementations multiple plasma grids may be used in a single grid assembly in the reaction chamber. Where multiple grids are used, the number of grids is typically between about 2 and 5. Often, where multiple plasma grids are used, at least one of the plasma grids is movable with respect to at least one other plasma grid. Generally, the movement is accomplished either by rotating or separating the grids (in some cases both types of movement are used). The use of a rotatable grid in a grid assembly allows the grid open area to be easily varied both between different processes/wafers, and within a single process/wafer over the course of processing the wafer. Importantly, the effective electron temperature and electron density in the lower sub-chamber will be a function of the grid open area.

Where multiple grids are used, it is helpful to define certain additional parameters. An assembly slot or other opening is an area of the assembly, as viewed from above, where an opening in one grid is aligned with an opening in the other grid(s), thus creating a clear line of sight through the plasma grid assembly, as shown in FIG. 3E. Where the slots/holes in the grids do not align, there is no clear line-of-sight through the grid assembly, as shown in FIG. 3F. With regard to FIGS. 3E-F, upper grid 302 is positioned above lower grid 304. The dark areas below each of the grids 302 and 304 are open areas through which species may travel. In a specific embodiment, the dark area below lower grid 304 is an upper portion of the lower sub-chamber. Multiple assembly opening are typically present in a single plasma grid assembly. The geometry of the assembly opening varies as the individual grids move with respect to one another. For example, the width of an assembly slot may vary as a first grid rotates with respect to a second grid. Similarly, the aspect ratio of the assembly slots, defined as total distance between the top of the top grid and bottom of the bottom grid divided by the line of sight open width, may vary as the grids rotate or otherwise move with respect to one another. In some embodiments, the aspect ratio of the assembly slots may range between about 0.1-5.

The grid assembly open area is defined as the total area of the slots on the grid assembly where the slots are aligned (as viewed from a plane parallel to the face of the grid). Where the slots are misaligned, as shown in FIG. 3F, certain species in the plasma (especially charged species such as ions and electrons) substantially do not pass through to the lower sub-chamber. This misaligned arrangement of slots effectively increases the aspect ratio of the slots in the assembly, or eliminates the assembly slots altogether where there is no slot overlap, reducing the fraction of hot electrons passing from the upper sub-chamber to the lower sub-chamber. Where the slots are aligned as in FIG. 3E, however, plasma species can pass through the slots as described above. In one example, two identical plasma grids are used, each having about 50% open (slotted) area. In this example, the grid assembly open area may vary between 0% (when the individual plasma grids are completely misaligned) and about 50% (when the individual plasma grids are exactly aligned). In another example, each plasma grid has an open area of about 75%. In this case, the grid assembly open area may vary between about 50-75%. By changing the grid assembly open area, the plasma conditions in the lower sub-chamber may be tuned. For example, when the grid assembly open area is larger, the effective electron temperature in the lower zone plasma is higher, the electron density in the lower zone plasma is higher, the ratio of electrons to ions in the lower zone plasma is higher, and the concentration of radicals in the lower zone plasma is lower, as compared to when the grid assembly open area is smaller.

The use of multiple grids is particularly beneficial because it provides a wide process window of plasma densities and other plasma conditions over the wafer in a single processing station. This benefit is especially helpful when processing complicated structures having multiple layers and/or multiple types of exposed materials. As mentioned, it is often necessary to change the processing conditions for each layer processed.

The slot pattern on each plasma grid may be the same or different from the other plasma grid slot pattern. Further, the slot patterns may be designed to provide open area over particular areas of the wafer. For example, the slots may be designed such that there is more open area near the center of the wafer compared to the edge of the wafer (or vice versa). Further, the slots may be designed such that the grid assembly open area is concentrated on different parts of the wafer at different times during the process. For example, the slots may be designed such that the grid assembly open area is concentrated near the center of the wafer towards the beginning of the process, and near the edge of the wafer towards the end of the process (or vice versa). This rotation allows the gas flow, plasma density, plasma type (e.g., ion-ion plasma), and effective electron temperature, to name a few parameters, to be tuned radially over the wafer over the course of the process. This tunability may be beneficial in producing uniform etch results over the entire face of the wafer, and may be particularly helpful in addressing center-to-edge non-uniformities that otherwise arise during processing. An example of a pair of electron grids that may be used in a plasma grid assembly to achieve these radial tuning effects is shown in FIGS. 3A-3B. In these figures, the slots (open area) are shown in gray and the grid material is shown in white.

The use of separable grids allows certain distances to be controlled and tuned. For example, distances that might be tuned include the distance between the wafer and the lower grid, the distance between the top of the upper sub-chamber and the upper grid, and/or the distance between the grids. These variable distances allow a wider range of electron temperature and plasma density tuning above the wafer compared to a single fixed grid.

Certain implementations utilize a plasma grid assembly having both movable and fixed plasma grids. The grids may be grounded or electrically floating, and may be supported by support legs or other feature connected to a movement causing element such as a rotational actuator or lifter. In some embodiments, the movement causing element is positioned below the wafer and wafer support pedestal, though other placements may be used. The support legs may be conductive or insulating, depending on whether the grid being supported is grounded or electrically floating.

Figure 4:
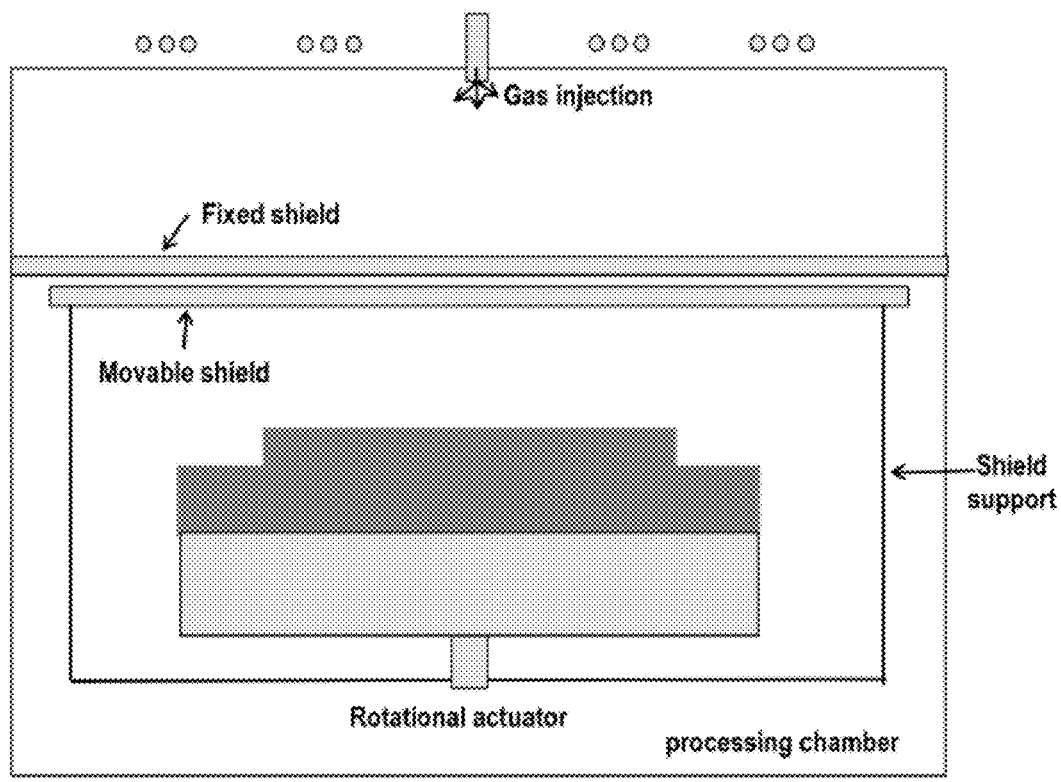
FIG. 4 illustrates a simplified representation of a processing chamber having a fixed plasma grid positioned over a movable plasma grid in accordance with an embodiment herein.
Figure 5:
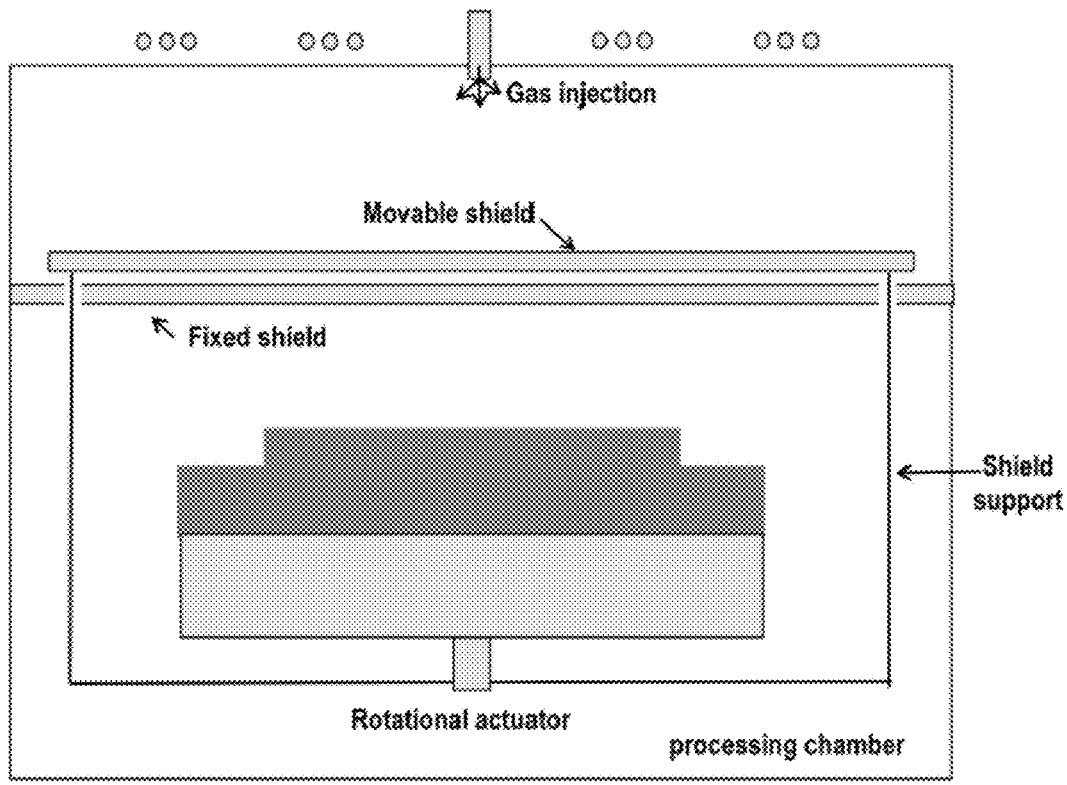
FIG. 5 shows a simplified representation of a processing chamber having a movable plasma grid over a fixed plasma grid in accordance with an embodiment herein.

It is generally beneficial for the fixed grid to be grounded. When the fixed grid is positioned above the movable grid, as shown in FIG. 4, the grounded connection of the fixed grid provides a good ground path for any RF current flowing to the grid from the upper chamber excitation source. This may be especially useful where the upper chamber is excited by an ICP source and is less than about 5 cm in height, or where the upper-zone plasma is generated using a VHF CCP source. When the fixed grid is positioned below the movable grid, as shown in FIG. 5, the grounded connection provides a large ground return surface for the bias current in the lower-zone plasma. This may be especially desirable where large bias voltages (e.g., greater than about 100 V) are required on the wafer during the etch process.

The optimal electrical connection of the movable grid may depend on the relative position of the fixed and movable grids. Where the fixed grid is positioned above the movable grid, it may be beneficial for the movable grid to be electrically floating. In contrast, where the fixed grid is positioned under the movable grid, the movable grid may be either grounded or floating. Where the movable grid is grounded, the support structure should be conductive (e.g., metallic). Where the movable grid is electrically floating, the support structure should be insulating.

When the fixed grid is positioned below the movable grid, the fixed grid may have arc shaped slots (or other slots allowing for arc-like movement across the slots) to allow the movable grid supports to extend through the fixed grid in order to connect the supports with the movement causing element. As noted above, this implementation is shown in FIG. 5. Alternatively, the movable grid may be supported by movable support structures extending inwards from the periphery of the reaction chamber, or it may be supported by a structure that connects with the top of the reaction chamber. Whatever implementation is used, the support structure should be designed such that it does not interfere with the formation of the upper and lower zone plasmas as desired. Further, it is desirable to keep the actuators for moving the grids well below the wafer plane such that there is minimal risk of particle transport from the actuators to the wafer.

The grid assembly can be biased using DC or RF sources. If the grid assembly has multiple conductive grids, it is desirable to bias them together to the same potential. Alternatively, the grid assembly may consist of only one conductive grid and one or more floating/insulating grids where only the conductive grid is biased.

Plasma Properties

The grid effectively divides the chamber plasma two zones: an upper zone proximate the coils for generating the plasma and a lower zone proximate the substrate holder. In various embodiments, the plasma in the upper zone contains relatively "hot", high-energy electrons. Often, this plasma is characterized as an electron-ion plasma. In various embodiments, the plasma in the lower zone contains relatively "cold", low-energy electrons. Often, this lower zone plasma is characterized as an ion-ion plasma.

Plasma may be generated primarily or exclusively in the upper sub-chamber. In one embodiment, an inductively coupled plasma is generated in the upper sub-chamber by running current through coils located above the upper sub-chamber. A single coil or multiple coils may be employed. In other embodiments, a capacitively coupled plasma is generated using, for example, a VHF CCP source. The plasma in the upper sub-chamber will have distinctly different characteristics from the plasma in the lower sub-chamber due to the presence of the grid.

In many embodiments, the upper zone plasma is a conventional electron-ion plasma. In this type of plasma, most of the positively charged species are positive ions and most of the negatively charged species are electrons. Although negative ions exist, they are present only in relatively low concentrations. In contrast, the plasma in the lower sub-chamber is an ion-rich plasma, often an ion-ion plasma. As compared to the electron-ion plasma, the ion-ion plasma has a greater proportion of negatively charged species that are negative ions, and a lower proportion of negatively charged species that are electrons. In certain implementations, the ratio of the concentration of positive ions to the concentration of electrons (sometimes referred to as the positive ion to electron ratio, $n_i/n_e$) in the ion-ion plasma is about 2 or greater, and in some cases is about 5 or greater, or even about 10 or greater. In certain cases, the positive ion to electron ratio is at least about 2 times greater (e.g., at least 5 times greater) in the lower plasma than in the upper plasma.

A related difference between the two plasmas is that the upper zone plasma has a significantly higher electron density. For example, the electron density in the lower zone plasma may be about $5\times10^9$ cm$^{-3}$ or less (e.g., about $1\times10^9$ cm$^{-3}$ or less). These ranges are particularly applicable to electron negative processing gases. The upper zone plasma may have an electron density that is at least about 10 times greater (e.g., at least about 100 times greater, or at least about 1000 times greater) than that of the lower zone plasma. In some cases, the lower sub-chamber has an ion-ion plasma where electron density is at least an order of magnitude smaller than the negative ion density and positive ion density. In a particular example, $Ne \sim 10^8$ cm$^{-3}$, $Ni+ \sim 10^9$ cm$^{-3}$, $Ni- \sim 10^9$ cm$^{-3}$.

An additional difference between the upper and lower zone plasmas, which is somewhat implicit based on the electron:ion ratios, is that the lower zone plasma will typically have a higher ratio of negative ions to positive ions. Because the upper zone electron-ion plasma typically contains primarily positive ions and electrons, with relatively few negative ions, the negative ion:positive ion ratio will be low. The negative ion:positive ion ratio in the lower zone plasma may be between about 0.5-1 (e.g., between about 0.8-0.95).

One non-limiting explanation for relatively low concentration of electrons in the lower zone plasma is that the electrons initially present in the lower zone (e.g., the electrons passing from the upper zone to the lower zone through the grid) are generally not heated by RF fields and quickly lose energy due to inelastic collisions with gas molecules, resulting in low effective electron temperature. These low energy electrons are more likely (as compared to the high energy electrons in the upper zone plasma) to interact with a neutral species to produce negative ions. Electrons must have a relatively low energy to attach to neutrals and form negative ions. This negative ion production will not occur with high energy electrons, which may "kick off" another electron when colliding with the neutral species instead of combining to form a negative ion.

As indicated, the effective electron temperature is greater in the upper zone plasma as compared to the lower zone plasma. Electrons may be cooled as they pass through the slots in the grid. Typically, the effective electron temperature in the lower zone plasma is about 1 eV or less. In certain cases, the effective electron temperature in the lower zone plasma may be between about 0.1-1 eV (e.g., between about 0.2-0.9 eV). The effective electron temperature may be at least about two times greater (e.g., at least about three times greater) in the upper zone plasma than in the lower zone plasma, as measured in electron volts. In a particular implementation, the upper zone plasma has an effective electron temperature of about 2.5 eV and the lower zone plasma has an effective electron temperature of about 0.8 eV. In various embodiments, this difference in the effective electron temperature arises wholly or partially from the presence of the grid.

Without being limited to any specific theory or mechanism, the role of the grid may be explained as follows. The grid may partially shield the lower sub-chamber such that the charged species therein are not directly exposed to power from the plasma coils. Additionally, the particular aspect ratios of the slots in the grid cause a fraction of the high energy electrons to collide with the grid when passing through the slots. This produces two qualitatively different plasmas in the two plasma zones.

Another distinguishing characteristic of the upper and lower zone plasmas is their plasma potentials. The plasma potential in the upper chamber is generally higher than in the lower chamber. For example, the plasma potential in the upper plasma may be between about 8-35 V (e.g., between about 10-20 V), while the plasma potential in the lower plasma may be between about 0.4-10 V (e.g., between about 0.5-3 V). This is because the electron energy has dropped and so the plasma does not need to be as positive to prevent electrons from leaving it.

Further, the two plasmas will typically have different energy distribution functions (e.g., ion energy distribution function and electron energy distribution function). Both the electron and ion energy distribution functions will be narrower in the lower plasma and broader in the upper plasma. By using the grid, it is possible to achieve a very narrow ion energy distribution function without using sophisticated control with a waveform generator. For example, the ion energy distribution function for the lower plasma might have a full width half maximum of only about 5 V. As a consequence, negative current can be drawn from negative ions, which arrive at the substrate surface to maintain electroneutrality (instead of electrons serving this purpose). This provides a unique etching mechanism.

The radical concentration in the lower zone plasma may range between about 1% of total neutral density to about 70% of the total neutral density, or about 10% to about 70% of the total neutral density or about 10% to about 50% of the total neutral density.

The chamber pressure during the etch operation may be below about 2000 mTorr, such as between about 1-2000 mTorr (e.g., between about 2-200 mTorr). In one particular example, the chamber pressure is maintained at or below about 20 mTorr. These pressures are particularly useful when employed with a lower zone plasma having an effective electron temperature of about 0.5 eV or lower and/or an electron density of about $5 \times 10^8$ cm$^{-3}$ or lower. These pressures are also particularly useful when employed with a lower zone ion-ion plasma.

Ion-ion plasmas are believed to provide certain benefits for semiconductor processing. For example, partially fabricated semiconductor devices etched in an ion-ion plasma show very good selectivity, profile angle, I/D loading, and overall uniformity across the face of the substrate being etched. Previous techniques could not achieve all of these benefits (i.e., process designers had to choose between, for example, achieving good overall etch uniformity and the other benefits). Thus, the embodiments herein represent a significant advancement in etching methodology.

Figure 6A:
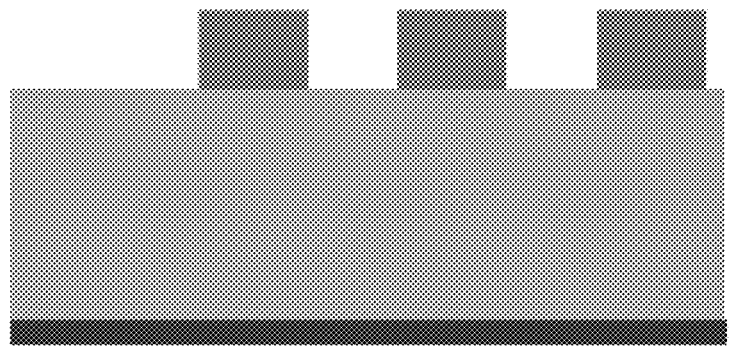
FIGS. 6A-6C illustrate certain problems that arise due to etching byproduct dissociation.
Figure 6B:
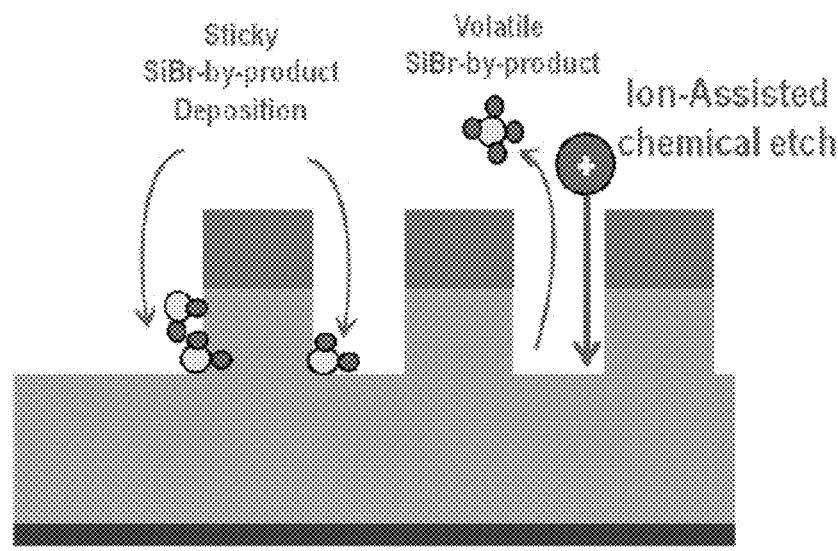
Figure 6C:
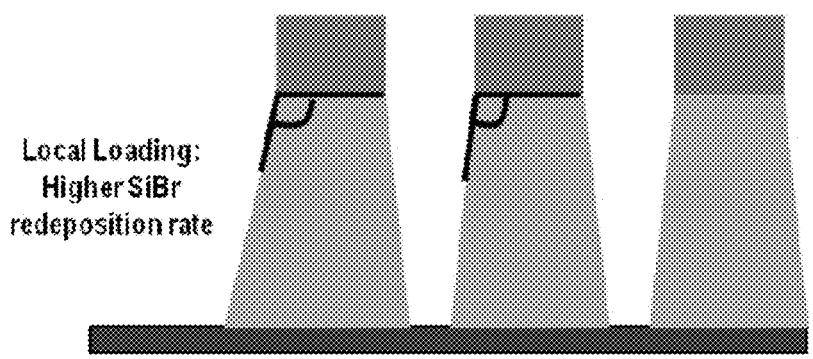

FIGS. 6A-6C illustrate the effect of the breakdown of etching byproducts on a feature being etched. To begin, FIG. 6A shows a substrate having three layers deposited thereon. The bottom layer represents a gate oxide, the middle layer represents polysilicon, and the top layer (shown as three separate blocks) represents a hard mask. It is believed that in a conventional etching process, the plasma present in the chamber acts, in part, to dissociate etching byproducts, as shown in FIG. 6B. These byproducts are often volatile components (e.g., $SiBr_4$), which under the right conditions are swept away from the substrate. However, when a high electron density plasma, which is typical of an electron-ion plasma, contacts the wafer, high energy electrons in the plasma can react with the volatile byproducts to cause them to dissociate into physico-chemically "sticky" dissociation products (e.g., $SiBr_2$). These dissociation products adhere to the substrate as shown in FIG. 6B, often to a sidewall of a feature being etched, and cause the etch process to occur in a non-vertical or otherwise undesirable manner, as shown in FIG. 6C. This dissociation product adherence/redeposition leads to local loading effects resulting in a non-vertical etch.

The use of a grid to reduce the effective electron temperature of the plasma proximate the substrate being etched reduces these undesirable effects. The production of an ion-ion plasma, with its correspondingly reduced electron density and effective electron temperature, therefore significantly reduces these undesirable effects. Because ions generally have significantly less energy than electrons, the ions in the present embodiments' ion-ion plasma do not cause this byproduct dissociation. Although the present embodiments may produce an electron-ion plasma, this high electron density/high effective electron temperature plasma may be confined to the upper sub-chamber. Therefore, etch byproducts tend to contact only the lower zone plasma, and do not come into contact with the high effective electron temperature, upper zone plasma. Further, although there will be some electrons present in the ion-ion plasma, these electrons generally have a low $T_e$ and therefore will not typically have enough energy to cause the byproduct dissociation. As such, the etch byproducts are not dissociated into "sticky" problem-causing compounds.

Wafer Biasing

In certain implementations, the wafer is biased during processing. This is accomplished by applying a bias to the electrostatic chuck used to hold/support the wafer. Because the wafer is exposed to a low $T_e$, low electron density plasma (such as an ion-ion plasma) in the lower sub-chamber, bias may be applied to the chuck in a way that captures/encourages the unique benefits of the ion-ion plasma. Further, the bias may be applied in a manner that avoids the formation of an electron-ion plasma in the lower sub-chamber. For example, the bias may have a frequency and power appropriate to prevent conversion of an ion-ion plasma to an electron-ion plasma.

In certain embodiments, the RF bias may have a frequency below 30 MHz, preferably between about 100 kHz to about 13.56 MHz, to reduce the amount of electron heating generated by the application of bias power to the substrate. In some embodiments, the bias (regardless of frequency) is pulsed in the range of about 1 Hz to about 10 kHz with a duty cycle of between about 1% and 99%.

In conventional electron-ion plasmas, the plasma potential is fairly high and positive, as described above. This plasma potential effectively limits the ability of electrons to escape the plasma. However, the lower zone plasma typically has an unconventionally low electron density and temperature and therefore requires a much lower plasma potential to effectively confine its electrons. The low plasma potential opens the operating window, optionally allowing negative ions present in the ion-ion plasma to accelerate towards and strike the wafer during the bias waveforms' positive cycle. This etching regime was previously unobtainable in continuous wave plasmas.

The frequency of the bias applied to the electrostatic chuck may be designed to optimize the formation and attraction of ions (particularly but not exclusively negative ions) in an ion-ion plasma. In this regard, the frequency of the bias applied to the electrostatic chuck is between about 0.1-15 MHz (e.g., between about 400 kHz-13.56 MHz). In a particular example, the bias is about 8 MHz. This frequency may be particularly useful, as it corresponds to the ion transport frequency. Other frequencies may also be used, but may be less effective. For example, frequencies between about 100 kHz-1 MHz may work to some extent, but may be less effective than the higher frequencies cited above.

It should be noted that where a grid is used and an AC bias of appropriate frequency is applied to the electrostatic chuck/wafer, the plasma sheath over the wafer can operate to alternatively pull negative ions and positive ions out of the plasma and accelerate them towards the face of the wafer. In other words, the plasma sheath will attract negative ions in a positive cycle and then positive ions in a negative cycle, and these cycles repeat with the AC bias. As explained above, this negative ion attraction (to the wafer) was not possible before implementation of the present embodiments because the plasma potential was too high, thereby drowning out any attractive effect from the relevant half of the AC bias cycles.

As mentioned, the bias may be applied in pulses. However, pulsing is not needed for many cases. The present embodiments achieve a stable ion-ion plasma above the wafer during the entire etching process. As such, the bias on the chuck/wafer does not need to be pulsed to achieve the benefits described herein. However, in certain embodiments, the bias may nevertheless be applied in pulses, such as to reduce the etch rate or the amount of ion bombardment of the substrate to increase the selectivity of the etch to the under-layer. Bias pulsing in ion-ion plasmas can be particularly beneficial by enhancing selectivity when alternating between ions and radicals. In other words, pulsing may partition the flux of ions and radicals to the substrate surface (pulse on: radicals + ions – pulse off: radicals only).

Process/Applications

The apparatus and plasma conditions disclosed herein may be used to etch any of a variety materials such as silicon (including polycrystalline, amorphous, single crystal, and/or microcrystalline silicon), metals (including but not limited to TiN, W, TaN, etc), oxides and nitrides (including but not limited to SiO, SiOC, SiN, SiON, etc.), organics (including but not limited to photoresists, amorphous carbon, etc), and a variety of other materials including, but not limited to, W, Pt, Ir, PtMn, PdCo, Co, CoFeB, CoFe, NiFe, W, Ag, Cu, Mo, TaSn, Ge2Sb2Te2, InSbTe Ag—Ge—S, Cu—Te—S, IrMn, Ru. The concept can be extended to materials like NiOx, SrTiOx, perovskite (CaTiO3), PrCAMnO3, PZT (PbZr1-xTixO3), (SrBiTa)O3, and the like. The apparatus can be used with any gas combination that is available in a present day fabrication facility (including HBr, CO, NH3, CH3OH, and the like).

The apparatus and plasma conditions disclosed herein may be employed to etch features in devices or other structures at any technology node. In some embodiments, the etch is used during fabrication of in the 20-10 nm nodes or beyond. Etching can before both front end of line fabrication procedures and back end of line fabrication procedures. The etching may provide superior vertical profile, material selectivity, I/D loading, and/or wafer center to edge uniformity of better than about 2%. A few examples of suitable etch applications include shallow trench isolation, gate etch, spacer etch, source/drain recess etch, oxide recess, and hard-mask open etch.

Apparatus

The methods described herein may be performed by any suitable apparatus. A suitable apparatus includes a chamber and electronic hardware for providing and maintaining etching conditions as described herein. Suitable apparatus will also include a system controller having instructions for controlling the hardware to achieve these conditions and for performing a sequence of process operations appropriate for applications such as etching a gate electrode of an FET. In some embodiments, the hardware may include one or more process stations included in a process tool.

Returning to FIG. 1, a cross-sectional view of an inductively coupled plasma etching apparatus 100 in accordance with certain embodiments is shown. As mentioned previously, the embodiments herein may be practiced with non-inductively coupled plasmas, as well. The inductively coupled plasma etching apparatus 100 includes an overall etching chamber structurally defined by chamber walls 101 and a window 111. The chamber walls 101 are typically fabricated from stainless steel or aluminum. The window 111 is typically fabricated from quartz or other dielectric material. An internal plasma grid 150 divides the overall etching chamber into an upper sub-chamber 102 and a lower sub-chamber 103. In certain other implementations, a more complex plasma grid assembly is used. For example, the plasma grid assembly may include multiple grids, as well as support structures and movement causing elements, as illustrated in FIGS. 4 and 5. Returning to the embodiment of FIG. 1, a chuck 117 is positioned within the lower sub-chamber 103 near the bottom inner surface. The chuck 117 is configured to receive and hold a semiconductor wafer (i.e., "wafer") 119 upon which the etching process is performed. The chuck 117 can be an electrostatic chuck for supporting the wafer when present. In some embodiments, an edge ring (not shown) surrounds chuck 117, and has an upper surface that is approximately planar with a top surface of a wafer, when present over chuck 117. The chuck 117 also includes electrostatic electrodes to enable the chucking and dechucking of the wafer. A filter and a DC clamp power supply may be provided for this purpose. Other control systems for lifting the wafer off of the chuck 117 can also be provided. The chuck 117 can be electrically charged using an RF power supply 123. The RF power supply 123 is connected to matching circuitry 121 through a connection 127. The matching circuitry 121 is connected to the chuck 117 through a connection 125. In this manner, the RF power supply 123 is connected to the chuck 117.

A coil 133 is positioned above the window 111. The coil 133 is fabricated from an electrically conductive material and includes at least one complete turn. The exemplary coil 133 shown in FIG. 1 includes three turns. The cross-sections of coil 133 symbols having an "X" indicate that the coil 133 extends rotationally into the page. Conversely, the coil 133 symbols having a "•" indicate that the coil 133 extends rotationally out of the page. An RF power supply 141 is configured to supply RF power to the coil 133. In general, the RF power supply 141 is connected to matching circuitry 139 through a connection 145. The matching circuitry 139 is connected to the coil 133 through a connection 143. In this manner, the RF power supply 141 is connected to the coil 133. An optional Faraday shield 149 is positioned between the coil 133 and the window 111. The Faraday shield 149 is maintained in a spaced apart relationship relative to the coil 133. The Faraday shield 149 is disposed immediately above the window 111. The coil 133, the Faraday shield 149, and the window 111 are each configured to be substantially parallel to one another. The Faraday shield may prevent metal or other species from depositing on the dielectric window of the plasma chamber.

Process gases may be supplied through a main injection port 160 positioned in the upper chamber and/or through a side injection port 170, sometimes referred to as an STG. Gas exhaust ports are not shown. Also not shown are pumps connected to the chamber 101 to enable vacuum control and removal of gaseous byproducts from the chamber during operational plasma processing.

During operation of the apparatus, one or more reactant gases may be supplied through the injection ports 160 and/or 170. In certain embodiments, gas may be supplied only through the main injection port, or only through the side injection port. In some cases, the injection ports may be replaced by showerheads. The Faraday shield 149 and/or grid 150 may include internal channels and holes that allow delivery of process gas to the chamber. In other words, either or both of Faraday shield 149 and grid 150 may serve as a showerhead for delivery of process gas.

Radiofrequency power is applied from the RF power supply 141 to the coil 133 to cause an RF current to flow through the coil 133. The RF current flowing through the coil 133 generates an electromagnetic field about the coil 133. The electromagnetic field generates an inductive current within the upper sub-chamber 102. The inductive current acts on the gas present in the upper sub-chamber 102 to generate an electron-ion plasma in the upper sub-chamber 102. The internal plasma grid 150 limits the amount of hot electrons in the lower sub-chamber 103. In various embodiments, the apparatus is designed and operated such that the plasma present in the lower sub-chamber is an ion-ion plasma.

Both the upper electron-ion plasma and the lower ion-ion plasma will contain positive ions and negative ions, though the ion-ion plasma will have a greater ratio of negative ions:positive ions. The physical and chemical interactions of the various ions and radicals with the wafer 119 selectively etch features of the wafer. Volatile etching byproducts are removed from the lower sub-chamber through an exhaust port (not shown). Importantly, these volatile byproducts are not substantially exposed to hot electrons, and therefore they are not likely to be dissociated into non-volatile "sticky" dissociation products.

Typically, the chuck disclosed herein operates at elevated temperatures ranging between about 30° Celsius and about 250° Celsius, preferably between about 30-150° Celsius. The temperature will depend on the etching process operation and specific recipe. The chamber 101 will also operate at pressures in the range of between about 1 mTorr and about 95 mTorr, or between about 5-20 mTorr.

Although not shown, chamber 101 is typically coupled to facilities when installed in a clean room, or a fabrication facility. Facilities include plumbing that provide processing gases, vacuum, temperature control, and environmental particle control. These facilities are coupled to chamber 101, when installed in the target fabrication facility. Additionally, chamber 101 may be coupled to a transfer chamber that will enable robotics to transfer semiconductor wafers into and out of chamber 101 using typical automation.

Figure 2A:
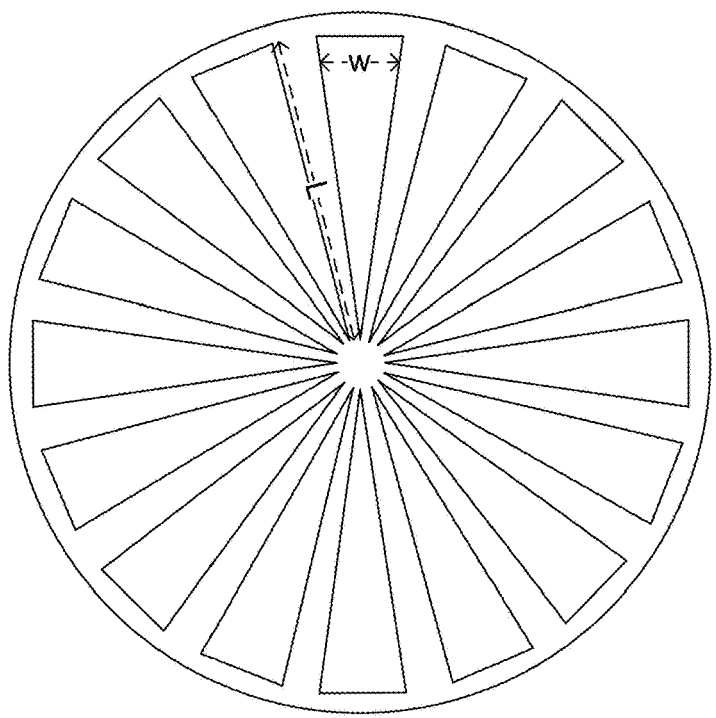
FIG. 2A is a simplified top-down view of a grid structure in accordance with certain embodiments disclosed herein.
Figure 2B:
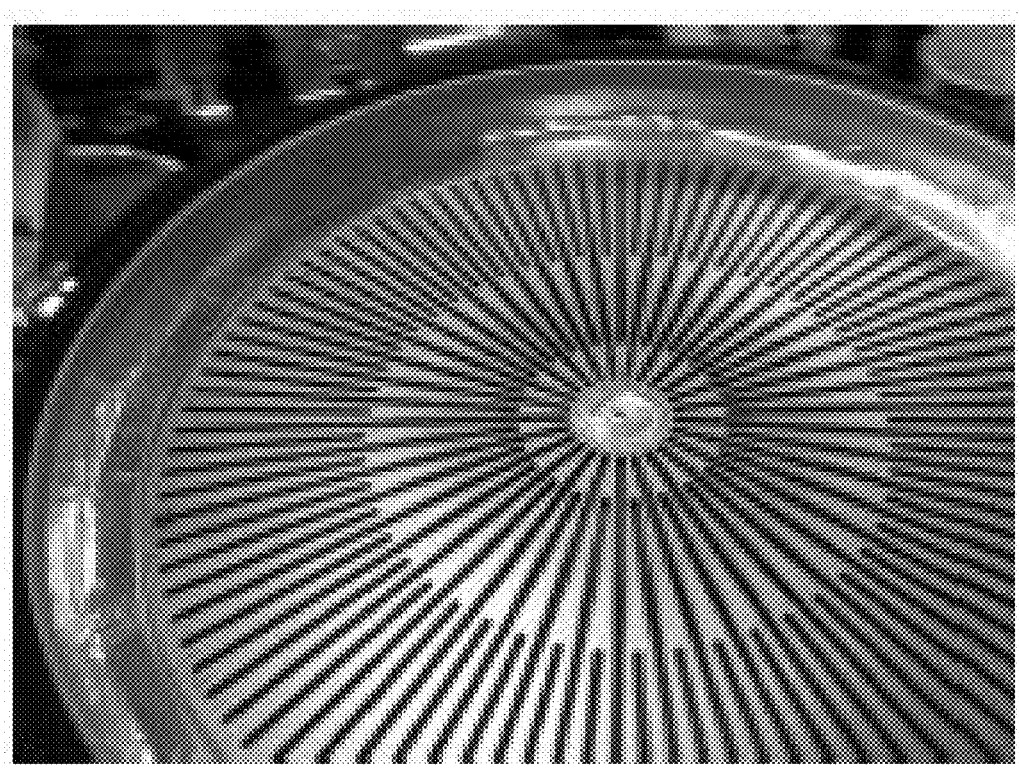
FIG. 2B is a picture of a grid structure in accordance with certain embodiments herein.
Figure 3C:
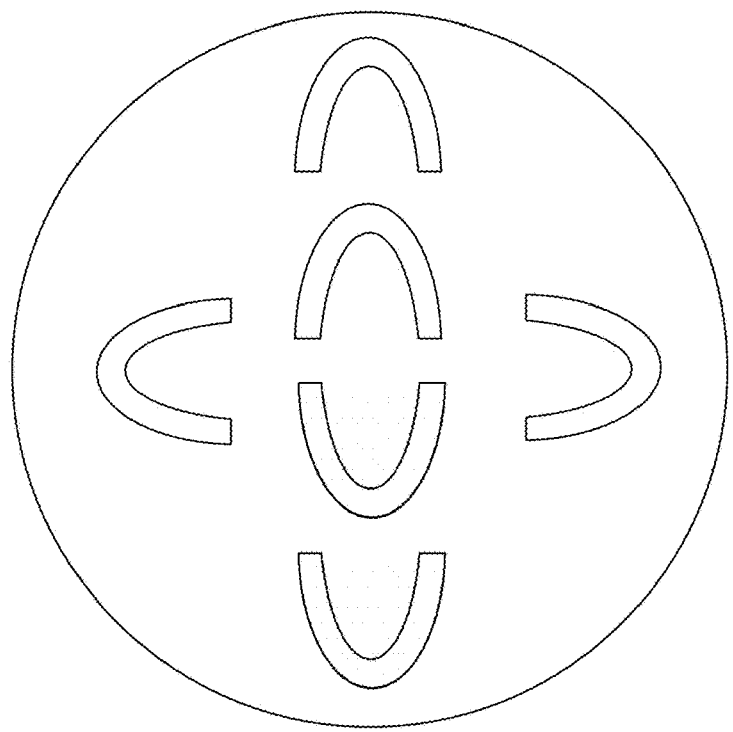
FIGS. 3C-3D illustrate a pair of plasma grids having C-shaped slots according to an embodiment herein.
Figure 3D:
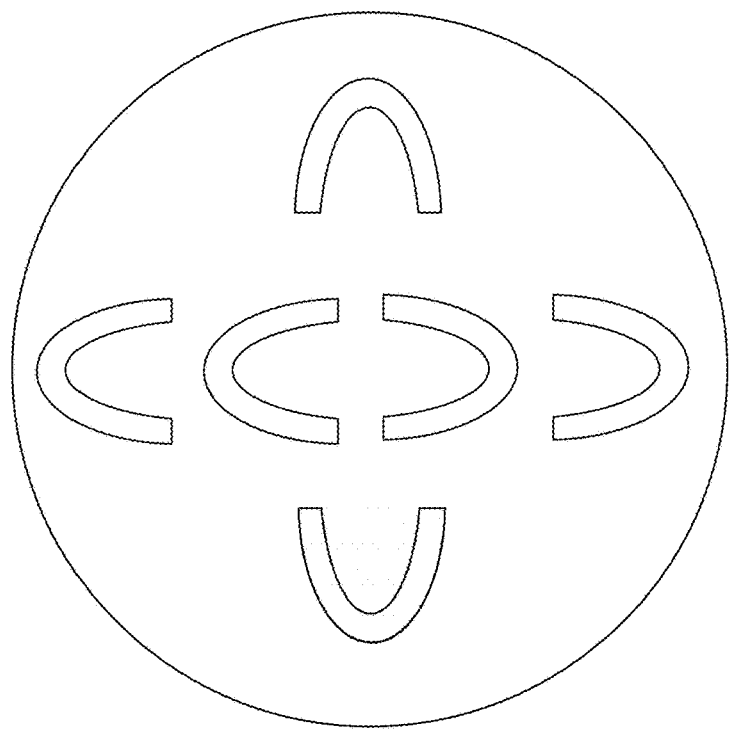
Figure 3E:
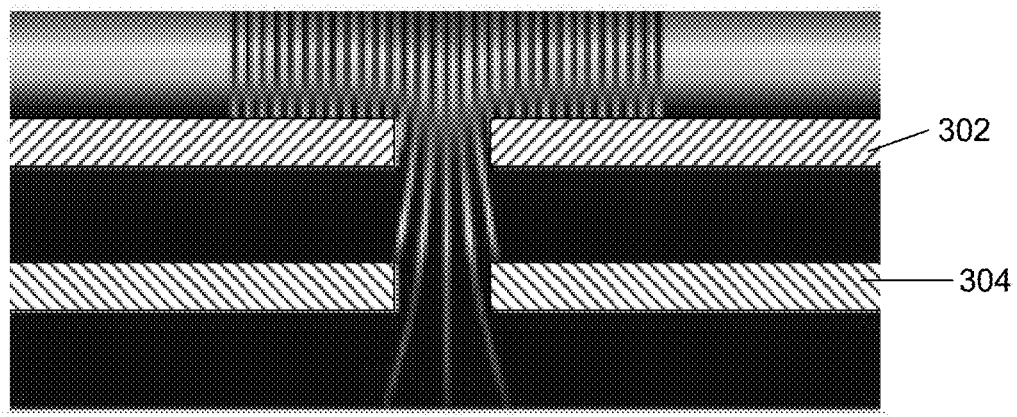
FIGS. 3E-3F illustrate close-up views of a grid assembly and the trajectory of ions through the assembly when the perforations in the top and bottom grids are aligned (FIG. 3E) and when they are not aligned (FIG. 3F).
Figure 3F:
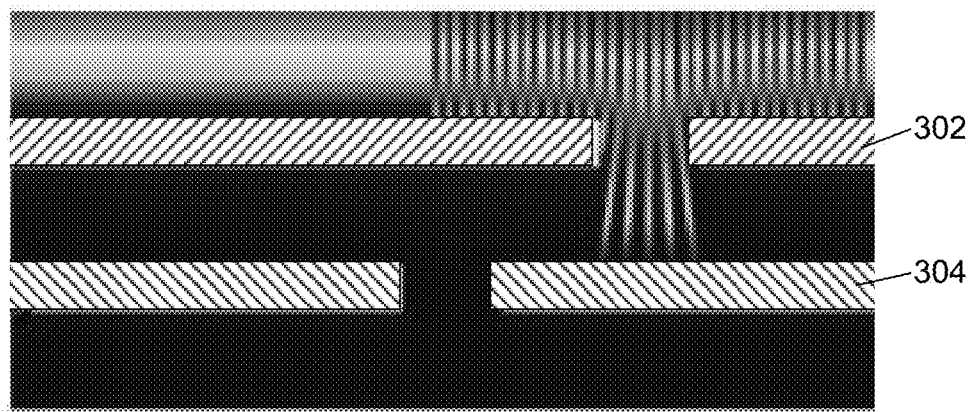

FIGS. 2A-2B and 3A-3D show examples of internal plasma grids in accordance with the embodiments herein. In certain cases, each grid may have slots that extend radially outward or roughly radially outward. In these or other cases, the slots may have a more unusual non-linear shape, as shown in FIGS. 3C-3D. In the embodiment of FIG. 2B, there are three types of slots. Each of the three slot types has a different slot length. The slots shown in FIG. 2B have an aspect ratio that is suitable for creating an ion-ion plasma in the lower sub-chamber, as described above. The slots shown in FIGS. 2A and 3A-3D may not be drawn to scale.

System Controller

In some embodiments, a system controller (which may include one or more physical or logical controllers) controls some or all of the operations of an etching chamber. The system controller may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network. In certain embodiments, the system controller executes system control software.

The system control software may include instructions for controlling the timing of application and/or magnitude of any one or more of the following chamber operational conditions: the mixture and/or composition of gases, chamber pressure, chamber temperature, wafer temperature, the bias applied to the wafer, the frequency and power applied to coils or other plasma generation components, wafer position, wafer movement speed, grid position, grid movement speed, and other parameters of a particular process performed by the tool. System control software may be configured in any suitable way. For example, various process tool component subroutines or control objects may be written to control operation of the process tool components necessary to carry out various process tool processes. System control software may be coded in any suitable computer readable programming language.

In some embodiments, system control software includes input/output control (IOC) sequencing instructions for controlling the various parameters described above. For example, each phase of a semiconductor fabrication process may include one or more instructions for execution by the system controller. The instructions for setting process conditions for an etching phase may be included in a corresponding etching recipe phase, for example. In some embodiments, the recipe phases may be sequentially arranged, so that all instructions for a process phase are executed concurrently with that process phase.

Other computer software and/or programs may be employed in some embodiments. Examples of programs or sections of programs for this purpose include a substrate positioning program, a grid assembly positioning program, a process gas composition control program, a pressure control program, a heater control program, and an RF power supply control program.

In some cases, the controllers control gas concentration, wafer movement, grid movement, and/or the power supplied to the coils and/or electrostatic chuck. The controller may control the gas concentration by, for example, opening and closing relevant valves to produce one or more inlet gas streams that provide the necessary reactant(s) at the proper concentration(s). The wafer movement may be controlled by, for example, directing a wafer positioning system to move as desired. The grid movement may be controlled by directing movement causing elements (e.g., a rotational actuator, lifter and/or other movement causing component) to position the grid assembly as desired. In one example the controller directs the rotational actuator to rotate one or more plasma grids to achieve certain plasma conditions (including but not limited to electron temperature, electron density, ion density, positive ion to electron ratio, etc.) in the lower zone plasma. In some implementations, the controller is configured to achieve different plasma conditions over different parts of the wafer (e.g., the plasma conditions may be radially tuned). The power supplied to the coils and/or chuck may be controlled to provide particular RF power levels to create the desired electron-ion plasma in the upper sub-chamber. Further, the controller may be configured to supply power to an electrostatic chuck under conditions such that an electron-ion plasma does not form in the lower sub-chamber. In other words, the controller is configured to maintain an ion-ion plasma (or at least a plasma with a suitably low effective electron temperature and density) in the lower sub-chamber. The controllers may control these or other aspects based on sensor output (e.g., when power, potential, pressure, etc. reach a certain threshold), the timing of an operation (e.g., opening valves at certain times in a process) or based on received instructions from a user.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

Experimental

Experiments have confirmed that the presently disclosed methods and apparatus provide for improved etching of partially fabricated devices on semiconductor substrates. When using a plasma grid, the etched product shows good selectivity, profile angle, iso/dense loading, and overall etch uniformity.

Figure 7A:
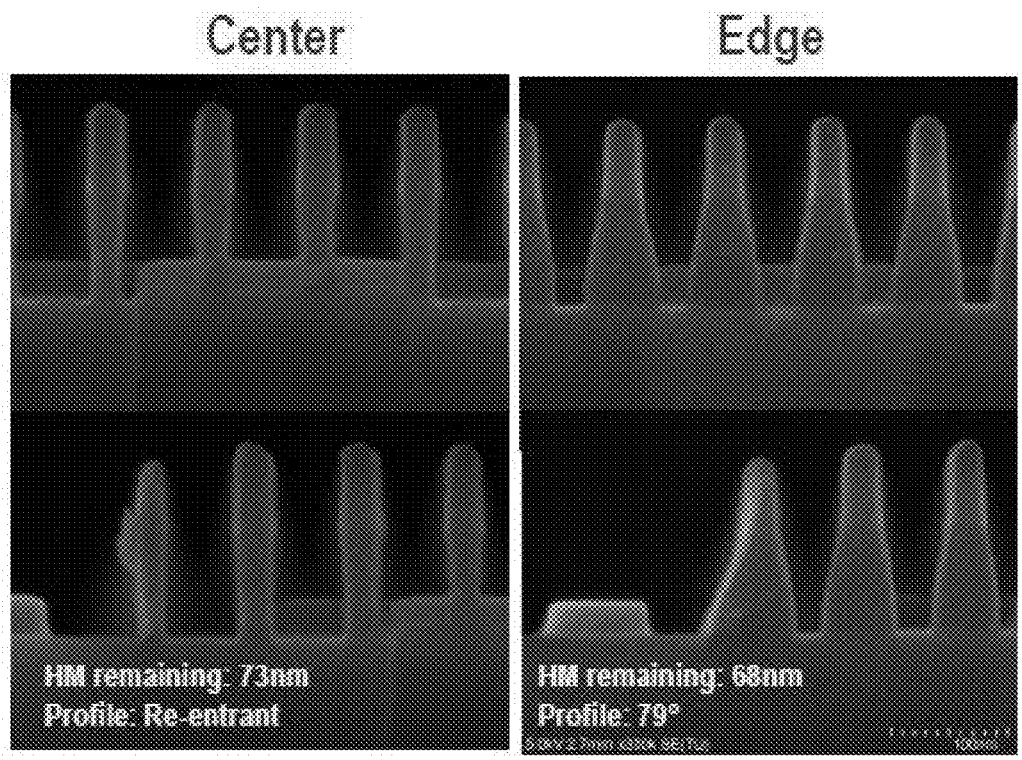
FIGS. 7A-7B show SEM images of FinFET structures that have been etched according to a high pressure conventional technique (7A) and according to an embodiment using a plasma grid (7B).
Figure 7B:
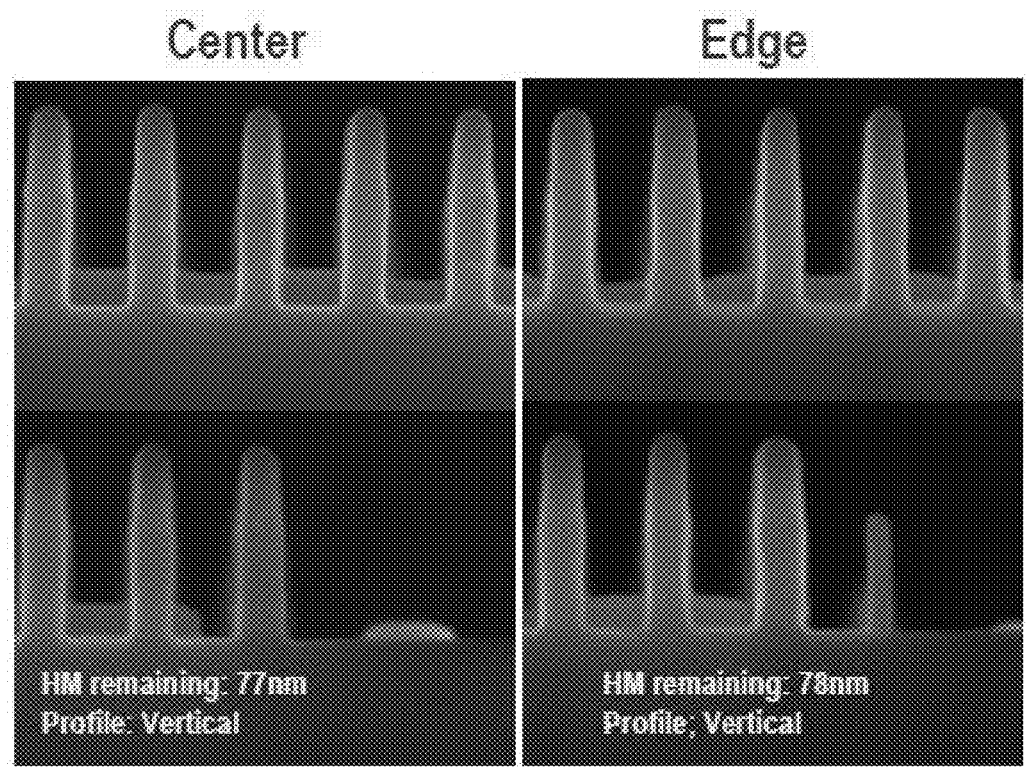

FIGS. 7A-7B show scanning electron microscope (SEM) images of FinFET structures that have been etched according to a high pressure conventional technique (7A) and according to the present embodiments using a plasma grid (7B). As shown in FIG. 7A, the conventional technique results in significant non-uniformity between the center and edge of the wafer. The I/D loading was large, and there was poor selectivity between the materials. Conversely, as shown in FIG. 7B, the use of the plasma grid substantially increases the center to edge uniformity. Further, the I/D loading was much lower, and the selectivity was improved. This experiment was performed on a Si carrier wafer thinned to a thickness representative of the FinFET height and covered with 50% SiN coupons to simulate the etch of a full-patterned wafer. The FinFET structures was over-etched by 65% to minimize the taper in the profile.

Figure 8B:
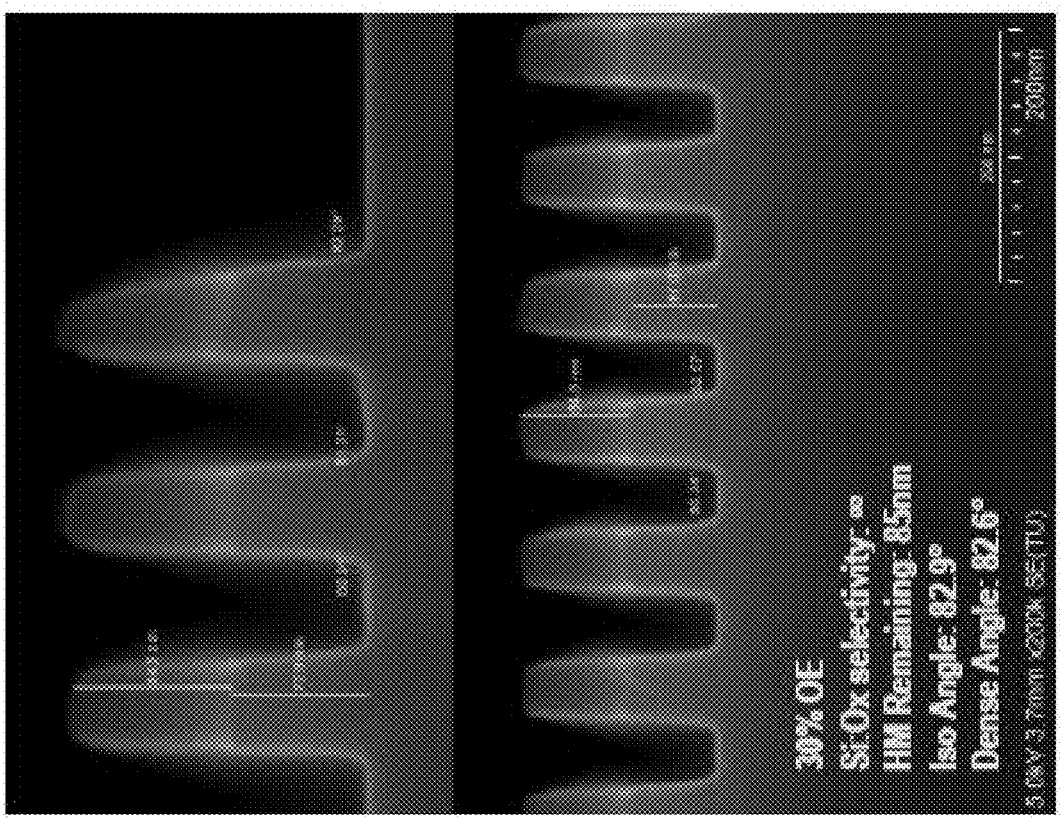
FIGS. 8A-8B show SEM images of features etched according to a low pressure conventional technique (8A) and according to a presently disclosed embodiment using a plasma grid (8B).
Figure 8A:
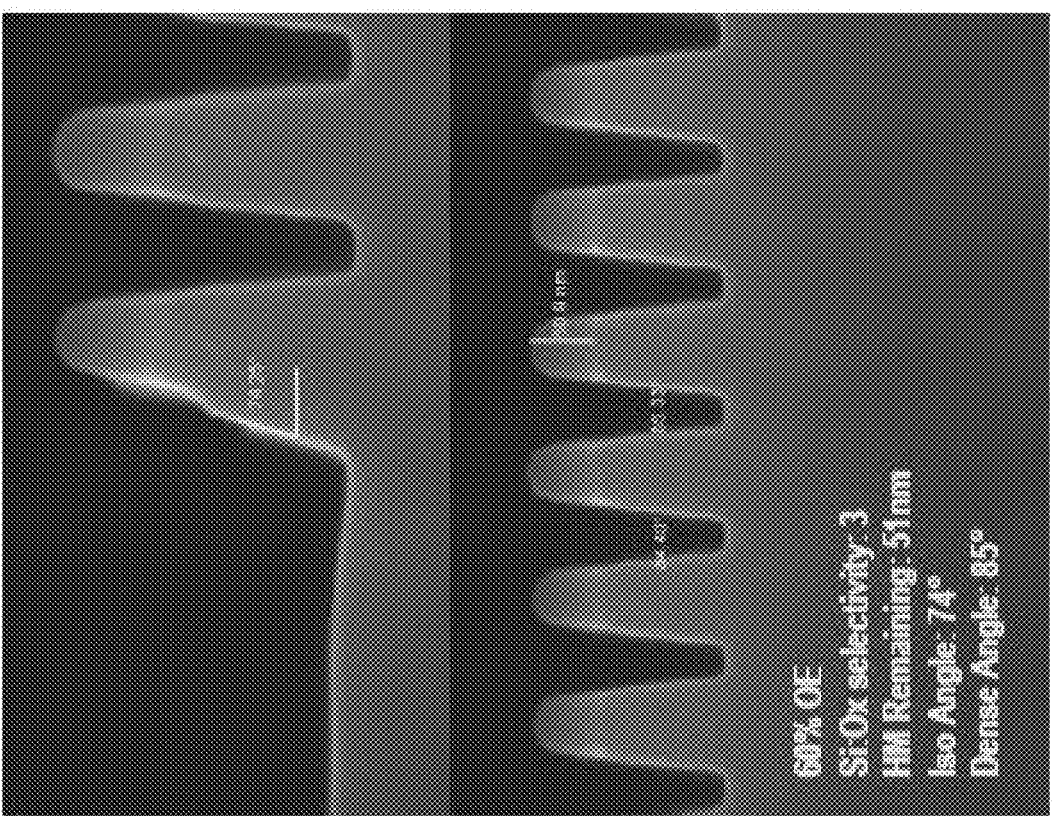

FIGS. 8A-8B show SEM images of features etched according to a low pressure conventional technique (8A) and according to the present embodiments using a plasma grid (8B). The conventional technique showed relatively poor selectivity between the silicon and oxide, the etched features had a tapered profile, and the I/D loading was poor. As shown in FIG. 8B, however, the source grid provided improved selectivity (infinite selectivity), a more vertical profile angle, and virtually no I/D loading. This experiment was performed on a chip cleaved from a patterned wafer and placed on the center of a carrier wafer. This experiment was performed on a Si carrier wafer thinned to a thickness representative of the FinFET height and covered with 50% SiN coupons to simulate the etch of a full-patterned wafer.

Figure 9:
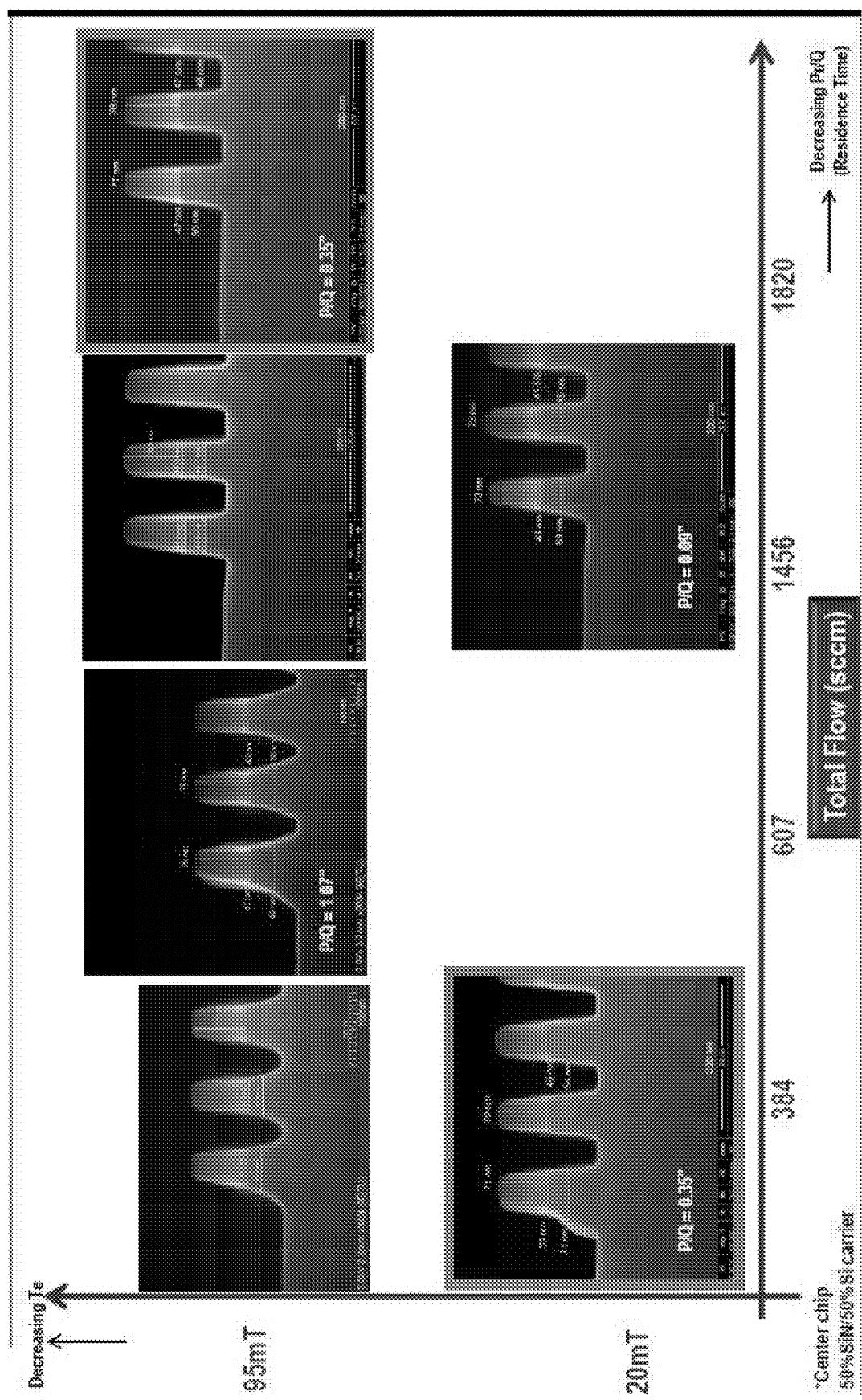
FIG. 9 shows various SEM images of features that have been etched according to various regimes without the use of a plasma grid.

FIG. 9 shows various SEM images of features that have been etched according to various regimes without the use of a plasma grid. Two different pressures were used, as well as four different total flow rates. The effective electron temperature (Te) decreases with increasing pressure. Residence time decreases with increasing total flow rate. For each pressure, increasing the total flow rate improves the etch results. In particular, the high flow cases show better (more vertical) profile angles and improved selectivity (more mask remaining). However, these improvements are mitigated by poorer I/D loading and center to edge uniformity. The results at high flow rates support the belief that certain byproducts and/or dissociation products, when not swept away in gaseous form, may be adhering to feature sidewalls and/or bottoms to produce poor etching results, as illustrated in FIGS. 6A-6C. When the total flow rate is higher, these byproducts are more effectively swept out of the reaction chamber and are less likely to cause etching defects.

Various experiments showed that the use of the plasma grid resulted in an etching process with very good selectivity, profile angle, I/D loading, and center to edge uniformity. In certain cases, the selectivity (i.e., the etch rate of Si:etch rate of oxide) is greater than about 10, or greater than about 100. In fact, infinite selectivity may be achieved using the plasma grid in certain cases. In these cases, there is virtually no etching of the oxide material, and there may even be a small amount of deposition on the oxide surface. The profile angle achieved in many cases is substantially vertical (e.g., over about 89°). In certain implementations, the I/D loading was shown to be below about 2°. Further, the center to edge uniformity in various implementations was less than about 2 nm.

What is claimed is:

1. A grid assembly for a reaction chamber comprising a plasma source above the grid assembly and a substrate support below the grid assembly, the reaction chamber being configured to perform plasma processing, the grid assembly comprising:
    a first grid comprising perforations that allow ions generated above the grid assembly to travel through the first grid and define a first open area pattern of the first grid;
    a second grid comprising perforations that allow ions generated above the grid assembly to travel through the second grid and define a second open area pattern of the second grid, the first and second grids being configured for use in the reaction chamber;
    wherein the first and second grids are substantially parallel and vertically aligned with one another such that the first grid is above the second grid when installed in the reaction chamber, and wherein the first and second grids are rotatable with respect to one another;
    wherein when the first and second grids are positioned at a first relative rotational position with respect to one another, the grid assembly has a first grid assembly open area pattern defined by an overlay of the first open area pattern of the first grid with the second open area pattern of the second grid in the first relative rotational position, and when the first and second grids are positioned at a second relative rotational position with respect to one another, the grid assembly has a second grid assembly open area pattern defined by an overlay of the first open area pattern of the first grid with the second open area pattern of the second grid in the second relative rotational position;
    wherein a radial length of the perforations of the first grid is different than a radial length of the perforations of the second grid, such that the second grid assembly open area pattern has more open area near an edge of the grid assembly than a center of the grid assembly compared to the first grid assembly open area pattern; and
    wherein, during operation of the reaction chamber having the grid assembly installed, plasma generated above the grid assembly results in a first ion flux distribution through the first grid assembly open area pattern when the first and second grids are positioned at the first relative position, and a second ion flux distribution through the second grid assembly open area pattern when the first and second grids are positioned at the second relative position, wherein the second ion flux distribution is relatively more concentrated near the edge of the grid assembly, as opposed to the center of the grid assembly, compared to the first ion flux distribution.

2. The grid assembly of claim 1, wherein the first and/or second grids of the grid assembly are configured to move along an axis perpendicular to a face of the first and/or second grid.

3. The grid assembly of claim 1, wherein at least one of the first and second grids is coated with a layer of $Y_2O_3$, $YF_3$, YAG, titanium nitride, or $CeO_2$.

4. The grid assembly of claim 1, wherein a surface of at least one of the first and second grids is anodized.

5. The grid assembly of claim 1, wherein a surface of at least one of the first and second grids is passivated.

6. The grid assembly of claim 1, wherein at least one of the first and second grids is non-planar.

7. The grid assembly of claim 1, wherein when the first and second grids are positioned at a third relative position, the perforations in the first and second grids are misaligned such that there is no grid assembly open area pattern.

8. The grid assembly of claim 1, wherein the perforations on at least one of the first and second grids comprise radially directed slots that prevent formation of induced current within the first and/or second grids.

9. The grid assembly of claim 1, further comprising a third grid that is vertically aligned with the first and second grids.

10. The grid assembly of claim 1, wherein at least one of the perforations in the first grid and/or the second grid has a height to width aspect ratio between about 0.5-2.

11. The grid assembly of claim 1, wherein the perforations in the first grid comprise a first shape and a second shape, the perforations of the first shape being positioned proximate a center of the first grid and the perforations of the second shape being positioned proximate a periphery of the first grid.

12. The grid assembly of claim 11, wherein the perforations of the first shape are substantially triangular and the perforations of the second shape are substantially trapezoidal.

13. The grid assembly of claim 12, wherein the perforations of the first shape and the perforations of the second shape are azimuthally offset from one another such the perforations of the first shape and the perforations of the second shape are not both present at any azimuthal position on the first grid.

14. The grid assembly of claim 13, wherein the perforations of the first shape are positioned substantially radially inside of a first radial position on the first grid, and the perforations of the second shape are positioned substantially radially outside of the first radial position on the first grid.

15. The grid assembly of claim 12, wherein the perforations in the second grid comprise a third shape, the third shape being substantially triangular and extending from proximate a center of the second grid to proximate a periphery of the second grid.

16. The grid assembly of claim 1, wherein the perforations in the second grid comprise a first shape and a second shape, the perforations of the first shape being positioned proximate a center of the second grid and the perforations of the second shape being positioned proximate a periphery of the second grid.

17. The grid assembly of claim 16, wherein the perforations of the first shape are substantially triangular and the perforations of the second shape are substantially trapezoidal.

18. The grid assembly of claim 17, wherein the perforations of the first shape and the perforations of the second shape are azimuthally offset from one another such the perforations of the first shape and the perforations of the second shape are not both present at any azimuthal position on the second grid.

19. The grid assembly of claim 18, wherein the perforations of the first shape are positioned substantially radially inside of a first radial position on the second grid, and the perforations of the second shape are positioned substantially radially outside of the first radial position on the second grid.

20. The grid assembly of claim 17, wherein the perforations in the first grid comprise a third shape, the third shape being substantially triangular and extending from proximate a center of the first grid to proximate a periphery of the first grid.

21. A grid assembly for a reaction chamber comprising a plasma source above the grid assembly and a substrate support below the grid assembly, the reaction chamber being configured to perform plasma processing, the grid assembly comprising:
- a first grid comprising perforations that allow ions generated above the grid assembly to travel through the first grid and define a first open area pattern of the first grid;
- a second grid comprising perforations that allow ions generated above the grid assembly to travel through the second grid and define a second open area pattern of the second grid, the first and second grids being configured for use in the reaction chamber;

wherein the first and second grids are substantially parallel and vertically aligned with one another such that the first grid is above the second grid when installed in the reaction chamber, and wherein the first and second grids are rotatable with respect to one another;

wherein when the first and second grids are positioned at a first relative rotational position with respect to one another, the grid assembly has a first grid assembly open area pattern defined by an overlay of the first open area pattern of the first grid with the second open area pattern of the second grid in the first relative rotational position, and when the first and second grids are positioned at a second relative rotational position with respect to one another, the grid assembly has a second grid assembly open area pattern defined by an overlay of the first open area pattern of the first grid with the second open area pattern of the second grid in the second relative rotational position;

wherein a radial length of the perforations of the first grid is different than a radial length of the perforations of the second grid, such that the second grid assembly open area pattern has more open area concentrated near an edge of the grid assembly than a center of the grid assembly compared to the first grid assembly open area pattern; and wherein, during operation of the reaction chamber having the grid assembly installed, plasma generated above the grid assembly results in a first ion flux distribution through the first grid assembly open area pattern when the first and second grids are positioned at the first relative position, and a second ion flux distribution through the second grid assembly open area pattern when the first and second grids are positioned at the second relative position, wherein the second ion flux distribution is relatively more concentrated near the edge of the grid assembly, as opposed to the center of the grid assembly, compared to the first ion flux distribution.

* * * * *